(12) United States Patent
Lin

(10) Patent No.: US 9,704,818 B1
(45) Date of Patent: Jul. 11, 2017

(54) SEMICONDUCTOR STRUCTURE AND MANUFACTURING METHOD THEREOF

(71) Applicant: NANYA TECHNOLOGY CORPORATION, Taoyuan (TW)

(72) Inventor: Po Chun Lin, Changhua (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 15/203,055

(22) Filed: Jul. 6, 2016

(51) Int. Cl.
*H01L 23/48* (2006.01)
*H01L 23/52* (2006.01)
*H01L 29/40* (2006.01)
*H01L 21/44* (2006.01)
*H01L 23/00* (2006.01)

(52) U.S. Cl.
CPC .............. *H01L 24/13* (2013.01); *H01L 24/03* (2013.01); *H01L 24/05* (2013.01); *H01L 24/11* (2013.01); *H01L 2224/036* (2013.01); *H01L 2224/0401* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05164* (2013.01); *H01L 2224/05184* (2013.01); *H01L 2224/1132* (2013.01); *H01L 2224/13017* (2013.01); *H01L 2224/13019* (2013.01); *H01L 2224/1319* (2013.01); *H01L 2224/13082* (2013.01); *H01L 2224/13111* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/13166* (2013.01); *H01L 2224/13184* (2013.01); *H01L 2924/06* (2013.01); *H01L 2924/0665* (2013.01); *H01L 2924/0715* (2013.01); *H01L 2924/07025* (2013.01); *H01L 2924/10252* (2013.01); *H01L 2924/10253* (2013.01); *H01L 2924/10271* (2013.01); *H01L 2924/10329* (2013.01); *H01L 2924/3511* (2013.01)

(58) Field of Classification Search
CPC ......... H01L 24/13; H01L 24/05; H01L 24/03; H01L 2224/13082
USPC ........................................ 257/737; 438/652
See application file for complete search history.

(56) References Cited

U.S. PATENT DOCUMENTS

| | | |
|---|---|---|
| 5,477,611 A | 12/1995 | Sweis et al. |
| 5,925,930 A | 7/1999 | Farnworth et al. |
| 5,998,875 A | 12/1999 | Bodo et al. |
| 6,103,552 A | 8/2000 | Lin |
| 6,197,613 B1 | 3/2001 | Kung et al. |
| 6,277,669 B1 | 8/2001 | Kung et al. |
| 6,555,908 B1 | 4/2003 | Eichelberger et al. |

(Continued)

FOREIGN PATENT DOCUMENTS

CN 101924045 A * 12/2010

*Primary Examiner* — David S Blum
(74) *Attorney, Agent, or Firm* — Muncy, Geissler, Olds & Lowe, P.C.

(57) ABSTRACT

A semiconductor structure includes a substrate; a pad disposed over the substrate; a passivation disposed over the substrate and exposing a portion of the pad; and a bump disposed over the portion of the pad. The bump includes a buffering member disposed over the portion of the pad; and a conductive layer surrounding the buffering member and electrically connected to the pad.

17 Claims, 26 Drawing Sheets

(56) References Cited

U.S. PATENT DOCUMENTS

| | | |
|---|---|---|
| 6,593,220 B1 | 7/2003 | Yu et al. |
| 6,649,507 B1 | 11/2003 | Chen et al. |
| 6,818,544 B2 | 11/2004 | Eichelberger et al. |
| 7,129,111 B2 | 10/2006 | Tsai |
| 7,476,968 B2 | 1/2009 | Shindo |
| 7,682,959 B2 | 3/2010 | Lin et al. |
| 7,749,886 B2 | 7/2010 | Oganesian et al. |
| 7,863,740 B2 | 1/2011 | Ke et al. |
| 8,253,248 B2 | 8/2012 | Ke et al. |
| 8,283,781 B2* | 10/2012 | Wu .................. H01L 23/3157 257/737 |
| 8,304,904 B2 | 11/2012 | Lin et al. |
| 8,354,750 B2 | 1/2013 | Wang et al. |
| 8,513,532 B2 | 8/2013 | Chen et al. |
| 8,643,150 B1 | 2/2014 | Xu et al. |
| 8,906,798 B2 | 12/2014 | Wang et al. |
| 8,946,891 B1 | 2/2015 | Nangalia et al. |
| 2002/0137304 A1 | 9/2002 | Yih et al. |
| 2005/0127508 A1* | 6/2005 | Lee et al. |
| 2007/0015312 A1 | 1/2007 | Tsai |
| 2007/0102829 A1* | 5/2007 | Lo et al. |
| 2009/0160052 A1* | 6/2009 | Yang et al. |
| 2011/0186987 A1 | 8/2011 | Wang et al. |
| 2011/0266668 A1* | 11/2011 | Haba |
| 2012/0043115 A1* | 2/2012 | Chen et al. |
| 2012/0273937 A1* | 11/2012 | Choi .................. H01L 21/4846 257/737 |
| 2013/0015575 A1 | 1/2013 | Lin et al. |
| 2013/0109169 A1 | 5/2013 | Wang et al. |
| 2014/0027900 A1* | 1/2014 | Chiu et al. |
| 2014/0077359 A1* | 3/2014 | Tsai et al. |
| 2014/0312512 A1* | 10/2014 | Choi |

* cited by examiner

SEMICONDUCTOR STRUCTURE AND MANUFACTURING METHOD THEREOF

TECHNICAL FIELD

The present invention relates to a semiconductor structure including a bump which comprises a buffering member for absorbing or relieving a stress over the bump or the semiconductor structure.

DISCUSSION OF THE BACKGROUND

Semiconductor devices are essential for many modern applications. With the advancement of electronic technology, semiconductor devices are becoming increasingly smaller in size while having greater functionality and greater amounts of integrated circuitry. Due to the miniaturized scale of semiconductor devices, wafer level chip scale packaging (WLCSP) is widely used for manufacturing. Numerous manufacturing steps are implemented within such small semiconductor devices.

However, the manufacturing of semiconductor devices in a miniaturized scale is becoming more complicated. An increase in the complexity of manufacturing semiconductor devices may cause deficiencies such as poor electrical interconnection, development of cracks or delamination of components. As such, there are many challenges for modifying the structure and manufacturing of semiconductor devices.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY

One aspect of the present disclosure provides a semiconductor structure comprising a substrate; a pad disposed over the substrate; a passivation disposed over the substrate and exposing a portion of the pad; and a bump disposed over the portion of the pad, wherein the bump includes a buffering member disposed over the portion of the pad; and a conductive layer surrounding the buffering member and electrically connected to the pad.

In some embodiments, the conductive layer is interfaced with the portion of the pad.

In some embodiments, the buffering member is insulative, elastic or deformable.

In some embodiments, the buffering member includes elastomer or polymer, or the conductive layer includes copper or solder.

In some embodiments, the bump is elastic or deformable.

In some embodiments, the bump is electrically connected to the pad.

In some embodiments, a portion of the buffering member is disposed within or extended into the pad.

In some embodiments, a portion of the conductive layer is disposed within or is surrounded by the buffering member.

In some embodiments, the semiconductor structure further includes an interconnect structure disposed between the conductive layer and the pad and configured to electrically connect the conductive layer with the pad.

In some embodiments, the interconnect structure is an under bump metallization (UBM) partially disposed over or partially surrounded by the passivation.

In some embodiments, the interconnect structure is disposed within or surrounded by the buffering member.

In some embodiments, the interconnect structure is conformal to the buffering member.

In some embodiments, a portion of the interconnect structure is disposed between the conductive layer and the buffering member.

In some embodiments, a portion of the interconnect structure is disposed within or is surrounded by the pad.

In some embodiments, the semiconductor structure further includes an adhesive disposed between the buffering member and the portion of the pad.

In some embodiments, the adhesive is disposed between the buffering member and the conductive layer, or the buffering member is encapsulated by the adhesive.

In some embodiments, the adhesive is disposed within or is surrounded by the pad.

Another aspect of the present disclosure provides a method of manufacturing a semiconductor structure which includes providing a substrate; disposing a pad over the substrate; disposing a passivation over the substrate and the pad; removing a portion of the passivation disposed over the pad; disposing a buffering member over a portion of the pad; and disposing a conductive layer over or around the buffering member, wherein the buffering member is surrounded by the conductive layer, and the conductive layer is electrically connected to the pad.

In some embodiments, the method further includes removing a portion of the pad upon or after the removal of the portion of the passivation.

In some embodiments, the buffering member is disposed by stencil squeezing.

The foregoing has outlined rather broadly the features and technical advantages of the present disclosure in order that the detailed description of the disclosure that follows may be better understood. Additional features and advantages of the disclosure will be described hereinafter, which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

Figure 1:
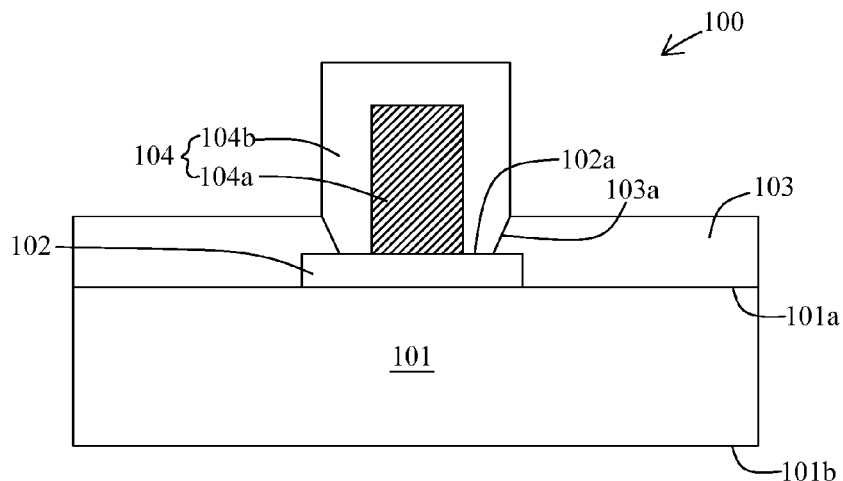
FIG. 1 is a schematic cross-sectional view of a semiconductor structure in accordance with some embodiments of the present disclosure.

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a semiconductor structure including a bump which comprises a buffering member for compensating a warpage of the semiconductor structure due to thermal expansion mismatch between components and relieving a stress over or within the semiconductor structure during manufacturing processes. In order to make the present disclosure completely comprehensible, detailed steps and structures are provided in the following description. Obviously, implementation of the present disclosure does not limit special details known by persons skilled in the art. In addition, known structures and steps are not described in detail, so as not to limit the present disclosure unnecessarily. Preferred embodiments of the present disclosure will be described below in detail. However, in addition to the detailed description, the present disclosure may also be widely implemented in other embodiments. The scope of the present disclosure is not limited to the detailed description, and is defined by the claims.

A semiconductor structure is electrically connected with another chip or package through a connector, such as a bump, a pillar, a post or the like. The connector is protruded from a pad of the semiconductor structure and configured to bond with another chip or package. Upon bonding of the connector with another chip or package, a stress or a force would be acted on the connector and cause damage to the connector as well as those components under the connector. Further, an internal stress would be developed during or after the bonding. A crack may develop in the connector or even propagate into the components. Delamination of components may occur. As a result, failure of electrical connection would occur.

In the present disclosure, a semiconductor structure is disclosed. The semiconductor structure includes a bump which comprises a buffering member surrounded by a conductive layer. The buffering member can provide elasticity of the bump, and thus can absorb force acted on the bump and relieve internal stress developed during manufacturing. Further, such an elastic bump can compensate warpage of the semiconductor structure caused by thermal expansion mismatch between components of the semiconductor structure. Therefore, cracks in the semiconductor structure and delamination of components can be minimized or prevented. Thus, reliability of the semiconductor structure can be improved.

FIG. 1 is a cross-sectional view of a semiconductor structure 100 in accordance with some embodiments of the present disclosure. In some embodiments, the semiconductor structure 100 includes a substrate 101, a pad 102, a passivation 103 and a bump 104. In some embodiments, the semiconductor structure 100 is a part of a die, a chip or a semiconductor package.

In some embodiments, the substrate 101 is fabricated with a predetermined functional circuit thereon. In some embodiments, the substrate 101 includes several conductive traces and several electrical components, such as transistors and diodes, connected by the conductive traces. In some embodiments, the substrate 101 is a semiconductive substrate. In some embodiments, the substrate 101 is a wafer. In some embodiments, the substrate 101 includes semiconductive material such as silicon, germanium, gallium, arsenic, and combinations thereof. In some embodiments, the substrate 101 is a silicon substrate. In some embodiments, the substrate 101 includes material such as ceramic, glass or the like. In some embodiments, the substrate 101 is a glass substrate. In some embodiments, the substrate 101 is in a quadrilateral, rectangular, square, polygonal or any other suitable shapes.

In some embodiments, the substrate 101 includes a first surface 101a and a second surface 101b opposite to the first surface 101b. In some embodiments, the first surface 101a is a front side or an active side where the circuits or electrical components are disposed thereon. In some embodiments, the second surface 101b is a back side or an inactive side.

In some embodiments, the pad 102 is disposed over the substrate 101. In some embodiments, the pad 102 is disposed over or within the first surface 101a of the substrate 101. In some embodiments, the pad 102 is disposed over the second surface 101b of the substrate 101. In some embodiments, the pad 102 is electrically connected to a circuitry or an electrical component in the substrate 101. In some embodiments, the pad 102 is electrically connected with a circuitry external to the substrate 101 so that the circuitry in the substrate 101 can electrically connect to the circuitry external to the substrate 101 through the pad 102. In some embodiments, the pad 102 is configured to receive a conductive structure. In some embodiments, the pad 102 is a die pad or a bond pad. In some embodiments, the pad 102 includes gold, silver, copper, nickel, tungsten, aluminum, palladium and/or alloys thereof.

In some embodiments, the passivation 103 is disposed over the first surface 101a or the second surface 101b of the substrate 101. In some embodiments, the passivation 103 is disposed over the substrate 101 and a periphery of the pad 102. In some embodiments, the passivation 103 partially covers the pad 102; as such, a portion 102a of the pad 102 is exposed from the passivation 103. In some embodiments, the passivation 103 surrounds the pad 102. In some embodiments, the passivation 103 is configured to provide an electrical insulation and a moisture protection for the substrate 101 so that the substrate 101 is isolated from an ambient environment.

In some embodiments, the passivation 103 includes several layers of dielectric material stacking over each other. In some embodiments, the passivation 103 is formed with dielectric materials, such as silicon oxide, silicon oxynitride, silicon nitride or the like. In some embodiments, the passivation 103 includes a recess 103a disposed over the pad 102. In some embodiments, the recess 103a exposes the portion 102a of the pad 102 such that the pad 102 can receive a conductive structure or electrically connect to a circuitry external to the substrate 101.

In some embodiments, the bump 104 is disposed over the first surface 101a or the second surface 101b of the substrate 101. In some embodiments, the bump 104 is disposed over the portion 102a of the pad 102. In some embodiments, the bump 104 is bonded with and electrically connected to the pad 102. In some embodiments, the bump 104 is partially surrounded by the passivation 103. In some embodiments, the bump 104 is disposed within the recess 103a of the passivation 103. In some embodiments, the bump 104 is configured to bond with a conductive structure, a chip or a package.

In some embodiments, the bump 104 is protruded from the pad 102 or the passivation 103. In some embodiments, the bump 104 is in a cylindrical, spherical or hemispherical shape. In some embodiments, the bump 104 is a solder joint, a solder bump, a solder ball, a ball grid array (BGA) ball, a controlled collapse chip connection (C4) bump, a microbump or the like. In some embodiments, the bump 104 is a conductive pillar or post.

In some embodiments, the bump 104 includes a buffering member 104a and a conductive layer 104b. In some embodiments, the buffering member 104a is disposed over and protruded from the portion 102a of the pad 102. In some embodiments, the buffering member 104a is extended from the pad 102 and away from the substrate 101. In some embodiments, the buffering member 104a stands upright over the pad 102. In some embodiments, the buffering member 104a is disposed within the recess 103a of the passivation 103. In some embodiments, the buffering member 104a is in a cylindrical shape. In some embodiments, a cross section of the buffering member 104a is in a circular, rectangular, quadrilateral or polygonal shape.

In some embodiments, the buffering member 104a is configured to absorb a force applied over the bump 104 or a stress internal to the semiconductor structure 100. In some embodiments, the buffering member 104a includes elastic, deformable, flexible or soft material. In some embodiments, the buffering member 104a includes dielectric material. In some embodiments, the buffering member 104a is insulative. In some embodiments, the buffering member 104a includes elastomer, silicone, resin, epoxy, polymer, polyimide or polybenzoxazole (PBO).

In some embodiments, the conductive layer 104b surrounds the buffering member 104a and electrically connects to the pad 102. In some embodiments, the conductive layer 104b encapsulates the buffering member 104a. In some embodiments, the conductive layer 104b is disposed conformal to the buffering member 104a. In some embodiments, an outer surface of the buffering member 104a is interfaced with the conductive layer 104b. In some embodiments, the conductive layer 104b is partially surrounded by the passivation 103. In some embodiments, the conductive layer 104b is interfaced with the portion 102a of the pad 102 such that the conductive layer 104b is electrically connected to the pad 102. In some embodiments, the conductive layer 104b includes copper, gold, silver, nickel, solder, tin, lead, tungsten, aluminum, titanium, palladium and/or alloys thereof.

In some embodiments, the bump 104 including the buffering member 104a is elastic, deformable or compressible. In some embodiments, the bump 104 is configured to absorb a force applied over the bump 104 or a stress internal to the semiconductor structure 100 such that development of cracks in the bump 104 or the semiconductor structure can be minimized or prevented. In some embodiments, the bump 104 is configured to relieve an internal stress caused by thermal expansion mismatch between components in the semiconductor structure 100. For example, a coefficient of thermal expansion (CTE) of the substrate 101 is different from a CTE of the passivation 103, and therefore expansion of the substrate 101 and the passivation 103 are different during thermal process, resulting in warpage of the semiconductor structure 100. The bump 104 with elasticity can mitigate or prevent the warpage or bending of the semiconductor structure 100. In some embodiments, the bump 104 is compressible such that a height of the bump 104 can be decreased when a force is applied over the bump 104. In some embodiments, such compressible bump 104 can compensate the warpage or bending of the semiconductor structure 100.

Figure 2:
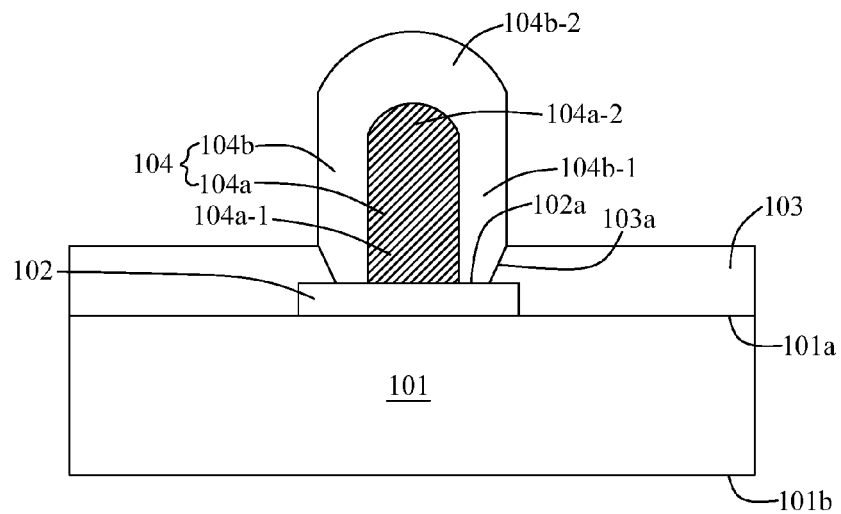
FIGS. 2-30 are schematic cross-sectional views of the semiconductor structure in various configurations or shapes in accordance with some embodiments of the present disclosure.
Figure 3:
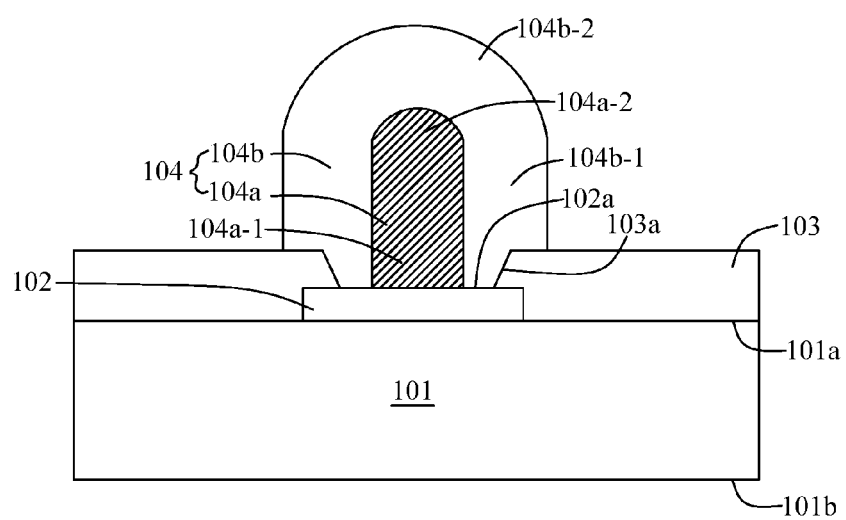

FIGS. 2 and 3 are cross-sectional views of the semiconductor structure 100 illustrating the buffering member 104 and the conductive layer 104b in various configurations. In some embodiments, the buffering member 104 includes a first cylindrical portion 104a-1 and a first dome portion 104a-2. In some embodiments, the first cylindrical portion 104a-1 is extended from the pad 102. In some embodiments, the first dome portion 104a-2 is disposed at an end of the first cylindrical portion 104a-1. In some embodiments, the conductive layer 104b is disposed conformal to an outer surface of the buffering member 104a. In some embodiments, the conductive layer 104b includes a second cylindrical portion 104b-1 and a second dome portion 104b-2. In some embodiments, the second cylindrical portion 104b-1 surrounds the first cylindrical portion 104a-1, and the second dome portion 104b-2 is disposed over the first dome portion 104a-2.

In some embodiments as shown in FIG. 2, a width of the bump 104 is substantially same or less than a width of the recess 103a. In some embodiments as shown in FIG. 3, the width of the bump 104 is substantially greater than the width of the recess 103a such that some of the conductive layer 104b is disposed over the passivation 103.

Figure 4:
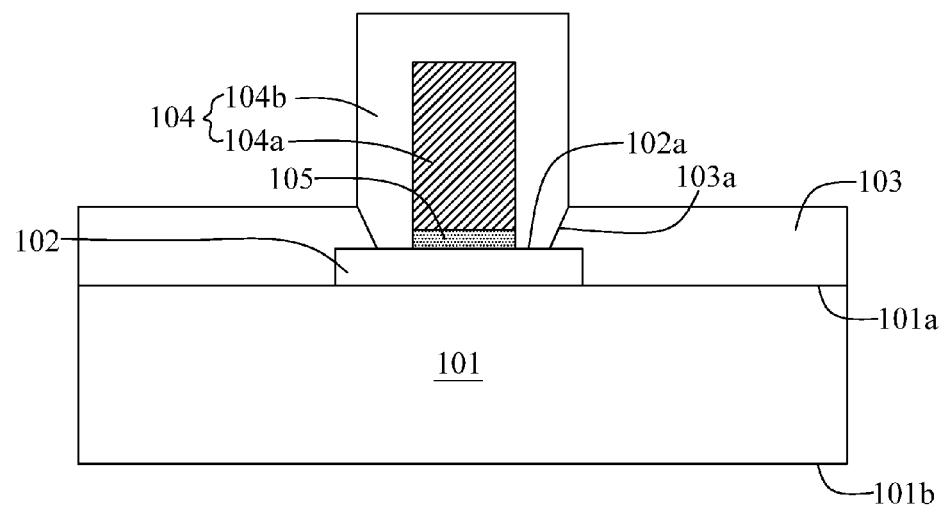
Figure 5:
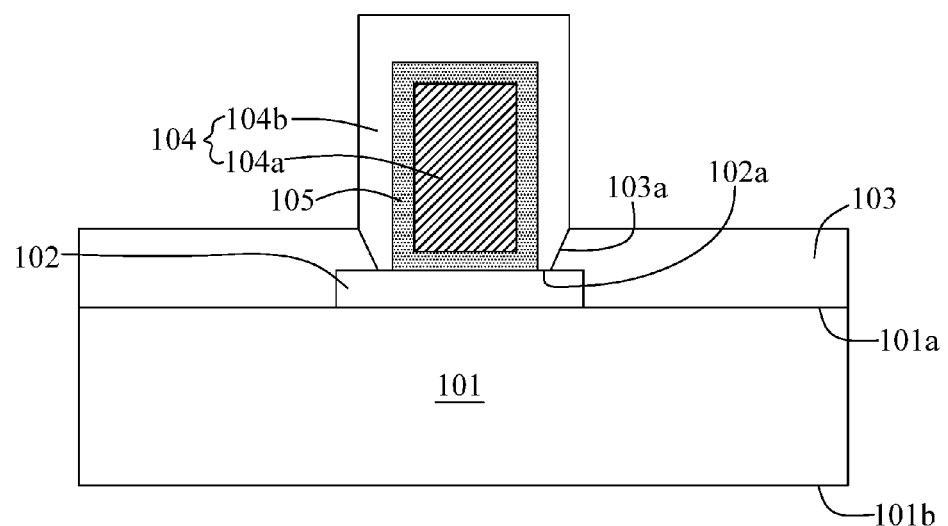

FIGS. 4 and 5 are cross-sectional views of the semiconductor structure 100 comprising an adhesive 105. In some embodiments, the adhesive 105 is disposed between the buffering member 104a and the portion 102a of the pad 102. In some embodiments, the buffering member 104a is attached on the pad 102 by the adhesive 105. In some embodiments, the adhesive 105 is disposed within the recess 103a and surrounded by the conductive layer 104b. In some embodiments, the adhesive 105 includes polymeric material. In some embodiments, the adhesive 105 is a glue, a flux, a die attach film (DAF) or the like.

In some embodiments as shown in FIG. 5, the adhesive 105 encapsulates the buffering member 104a. In some embodiments, the adhesive 105 is disposed between the buffering member 104a and the conductive layer 104b. In some embodiments, the adhesive 105 is surrounded by the conductive layer 104b. In some embodiments, the adhesive 105 is disposed conformal to the outer surface of the buffering member 104a. In some embodiments, the conductive layer 104b is disposed conformal to an outer surface of the adhesive 105.

Figure 6:
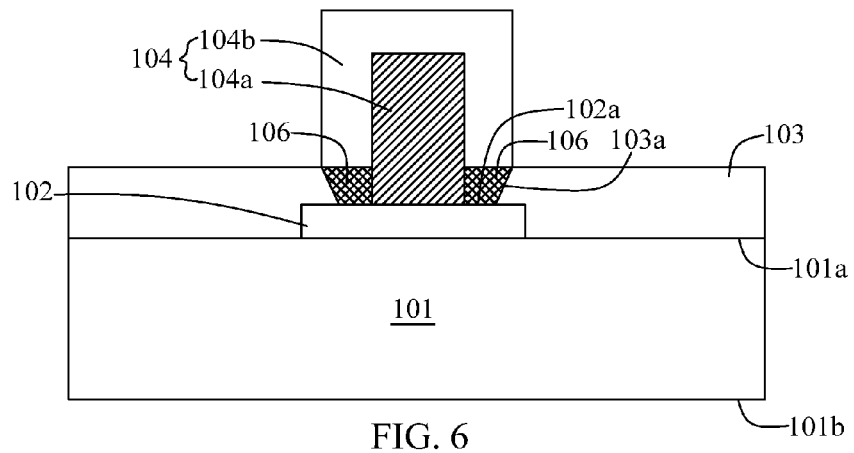
Figure 7:
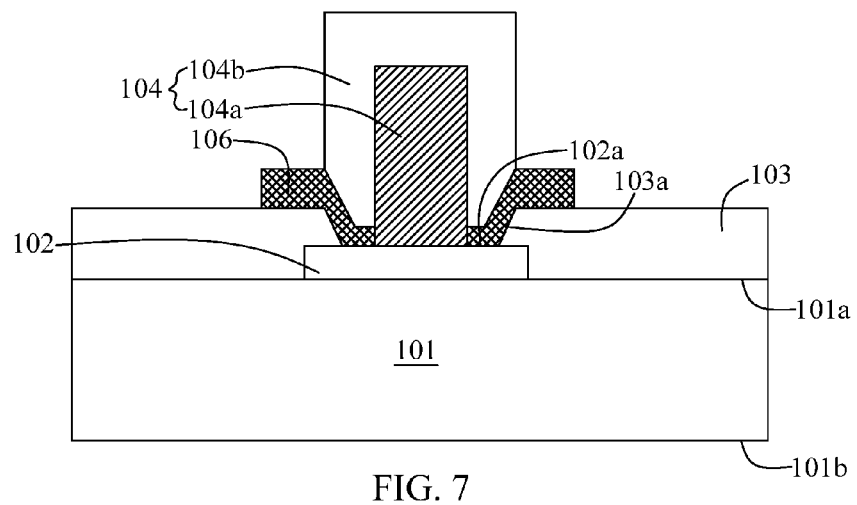
Figure 8:
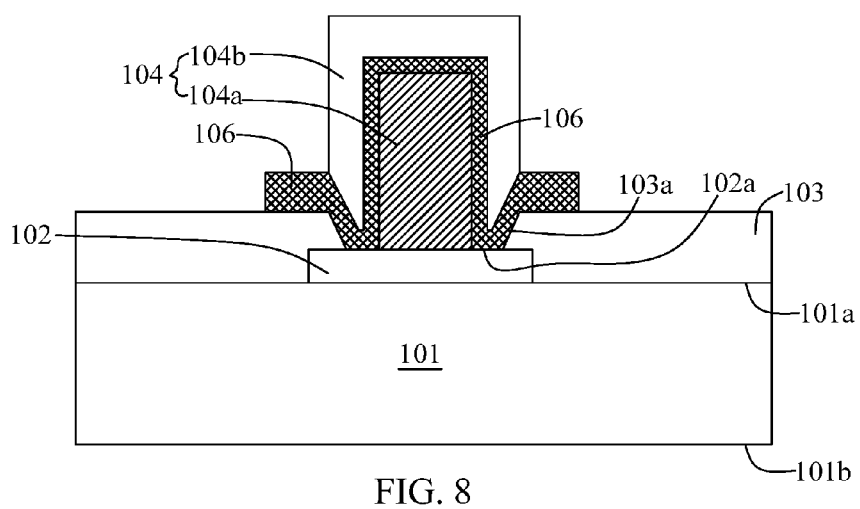

FIGS. 6-8 are cross-sectional views of the semiconductor structure 100 comprising an interconnect structure 106. In some embodiments, the interconnect structure 106 is disposed between the conductive layer 104b and the pad 102. In some embodiments, the interconnect structure 106 surrounds the buffering member 104a. In some embodiments, the interconnect structure 106 is configured to electrically connect the conductive layer 104b with the pad 102. In some embodiments, the interconnect structure 106 includes conductive material such as copper, gold, silver, nickel, solder, tin, lead, tungsten, aluminum, titanium, palladium and/or alloys thereof.

In some embodiments as shown in FIG. 6, the interconnect structure 106 is disposed within the recess 103a and surrounded by the pad 102, the passivation 103 and the conductive layer 104b. In some embodiments as shown in FIG. 7, the interconnect structure 106 is partially disposed over and partially surrounded by the passivation 103. In some embodiments, the buffering member 104a and the conductive layer 104b are surrounded by the interconnect structure 106. In some embodiments as shown in FIG. 8, the interconnect structure 106 is disposed conformal to the outer surface of the buffering member 104a so as to surround the buffering member 104a. In some embodiments, the conductive layer 104b is disposed conformal to a portion of an outer surface of the interconnect structure 106. In some embodiments, a portion of the interconnect structure 106 is disposed between the buffering member 104a and the conductive layer 104b.

In some embodiments, the interconnect structure 106 is an under bump metallization (UBM) or is a part of the UBM. In some embodiments, a barrier layer and a seed layer are disposed between the UBM and the pad 102. In some embodiments, the barrier layer is disposed over the pad 102, and the seed layer is disposed over the barrier layer. In some embodiments, the barrier layer is configured to prevent the conductive layer 104a from diffusing into the pad 102. In some embodiments, the barrier layer includes gold, silver, nickel, tin, lead or the like. In some embodiments, the seed layer is configured to adhere the UBM to the pad 102. In some embodiments, the seed layer includes copper, gold, silver, nickel, solder, tin, lead, aluminum, titanium or the like.

Figure 9:
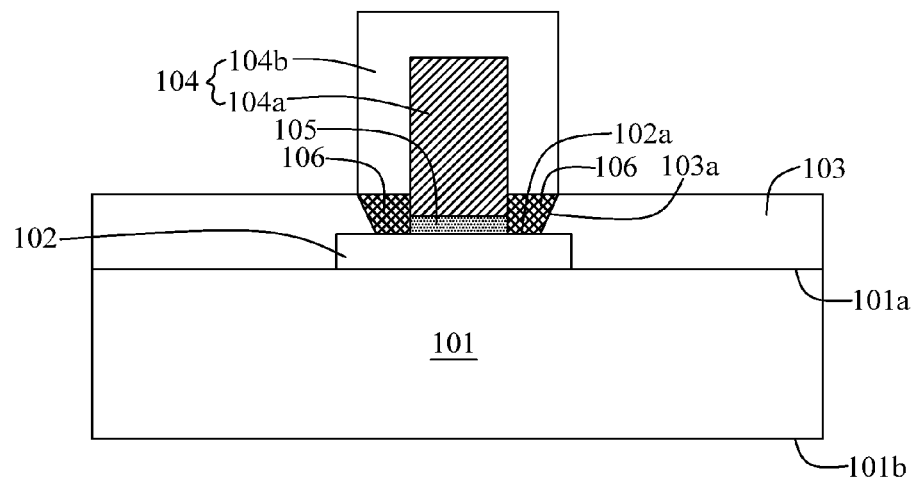
Figure 10:
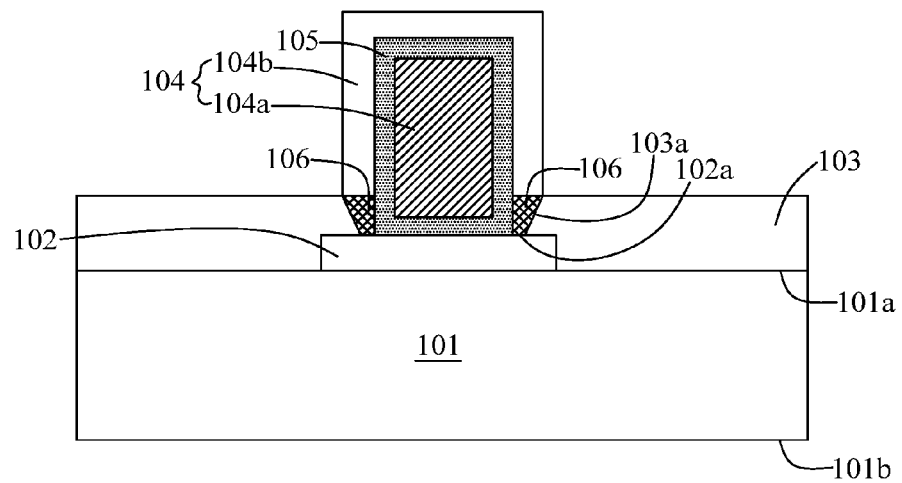
Figure 11:
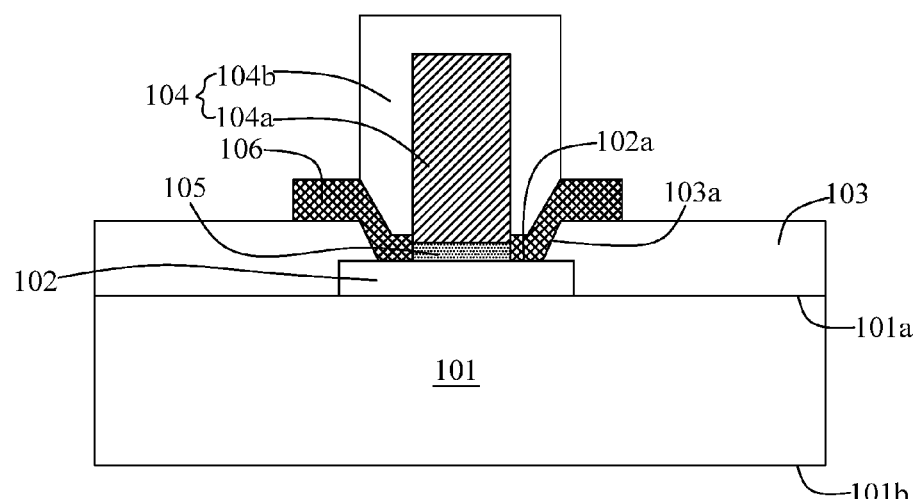
Figure 12:
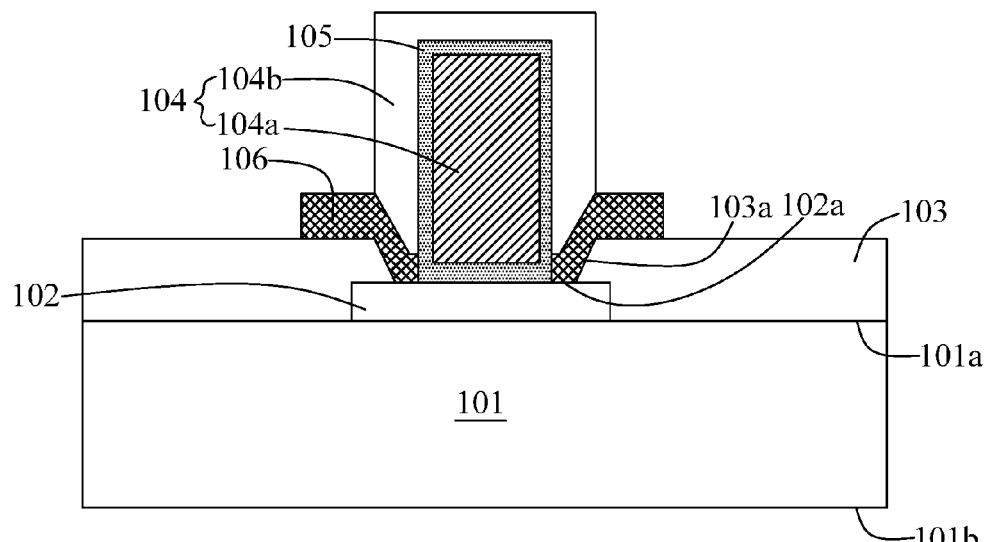
Figure 13:
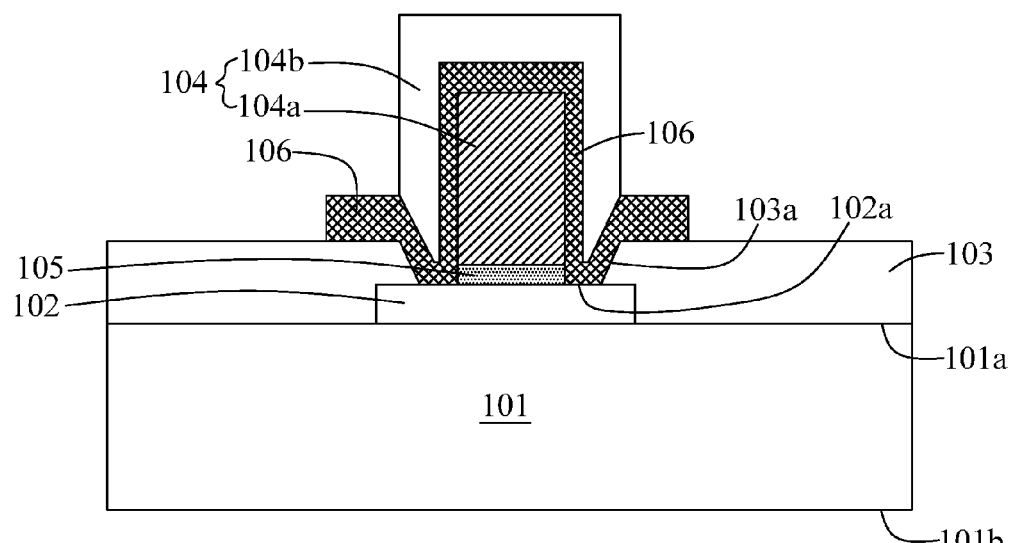

FIGS. 9-13 are cross-sectional views of the semiconductor structure 100 comprising the adhesive 105 and the interconnect structure 106. In some embodiments as shown in FIG. 9, the semiconductor structure 100 includes the adhesive 105 as illustrated in FIG. 4 and the interconnect structure 106 as shown in FIG. 6. In some embodiments, the interconnect structure 106 surrounds the adhesive 105. In some embodiments as shown in FIG. 10, the semiconductor structure 100 includes the adhesive 105 as illustrated in FIG. 5 and the interconnect structure 106 as illustrated in FIG. 6. In some embodiments as shown in FIG. 11, the semiconductor structure 100 includes the adhesive 105 as illustrated in FIG. 4 and the interconnect structure 106 as illustrated in FIG. 7. In some embodiments as shown in FIG. 12, the semiconductor structure 100 includes the adhesive 105 as illustrated in FIG. 5 and the interconnect structure 106 as illustrated in FIG. 7. In some embodiments as shown in FIG. 13, the semiconductor structure 100 includes the adhesive 105 as illustrated in FIG. 4 and the interconnect structure 106 as illustrated in FIG. 8.

Figure 14:
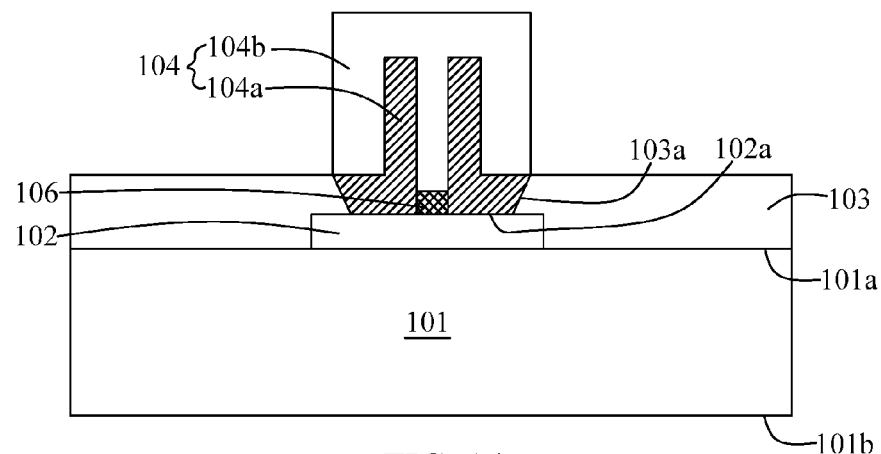
Figure 15:
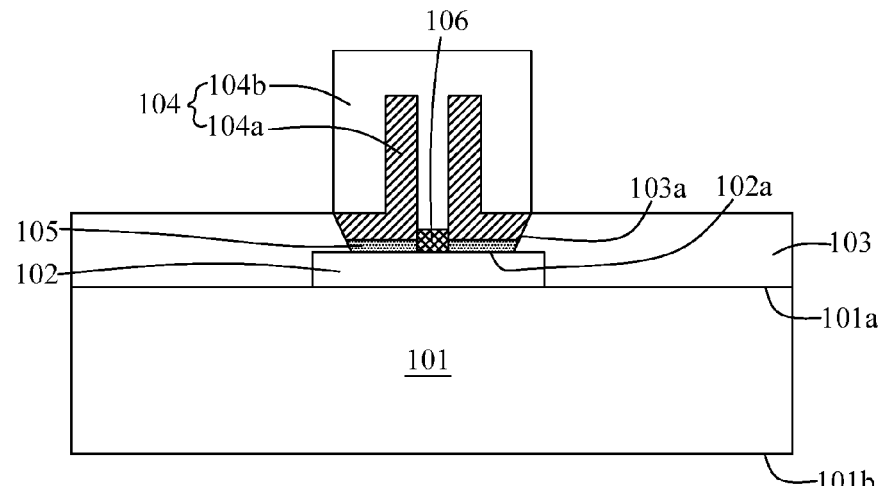
Figure 16:
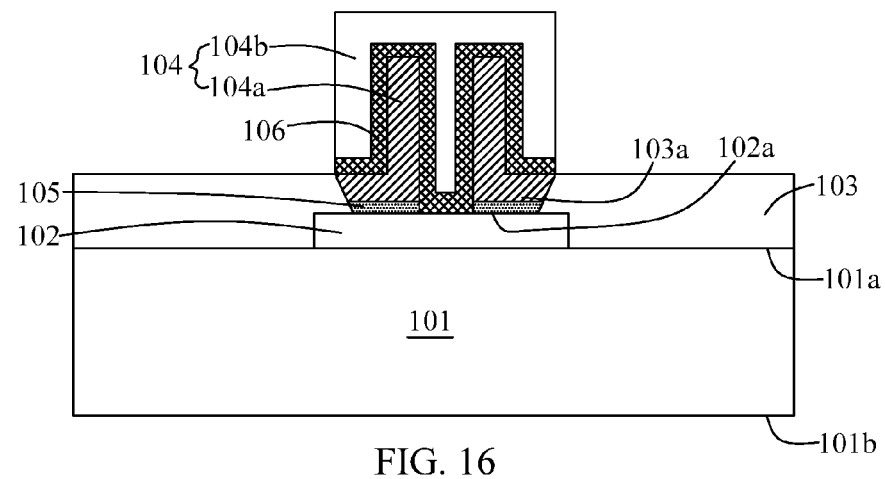

FIGS. 14-16 are cross-sectional views of the semiconductor structure 100 comprising the adhesive 105 and the interconnect structure 106 in various configurations. In some embodiments as shown in FIG. 14, the interconnect structure 106 and a portion of the conductive layer 104b are disposed within or surrounded by the buffering member 104a. In some embodiments as shown in FIG. 15, the adhesive 105 is disposed between the buffering member 104a and the pad 102, and the interconnect structure 106 is disposed within the buffering member 104a and the adhesive 105. In some embodiments as shown in FIG. 16, the interconnect structure 106 is disposed conformal to the buffering member 104a, and a portion of the interconnect structure 106 is disposed within the buffering member 104a.

Figure 17:
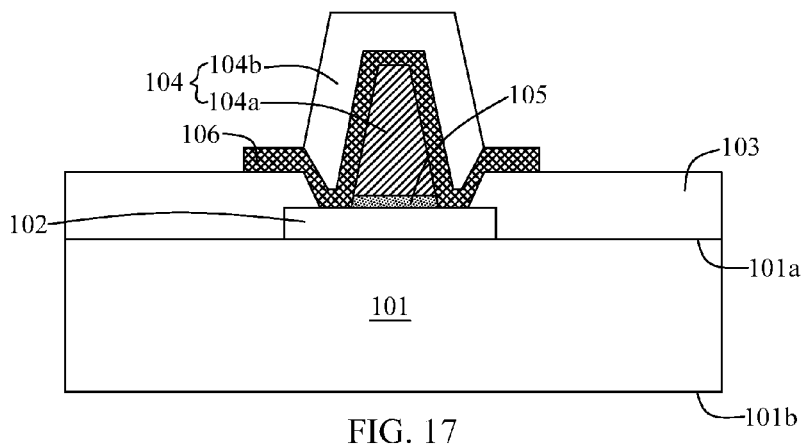
Figure 18:
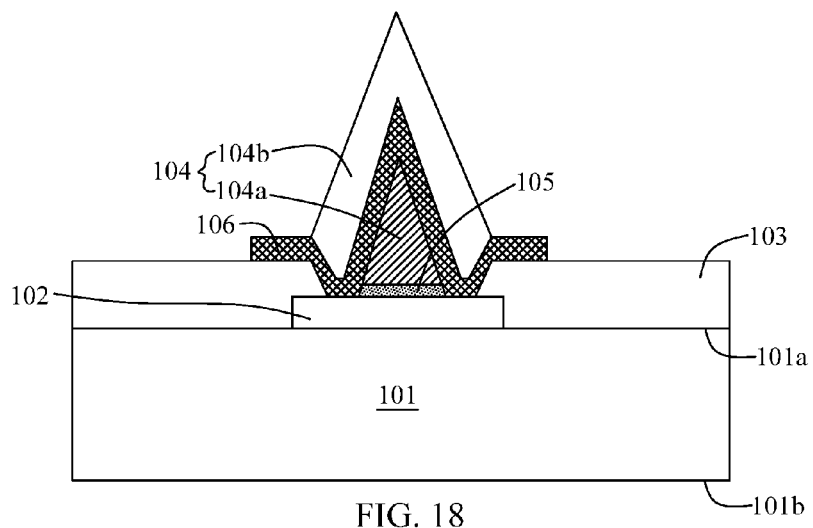
Figure 19:
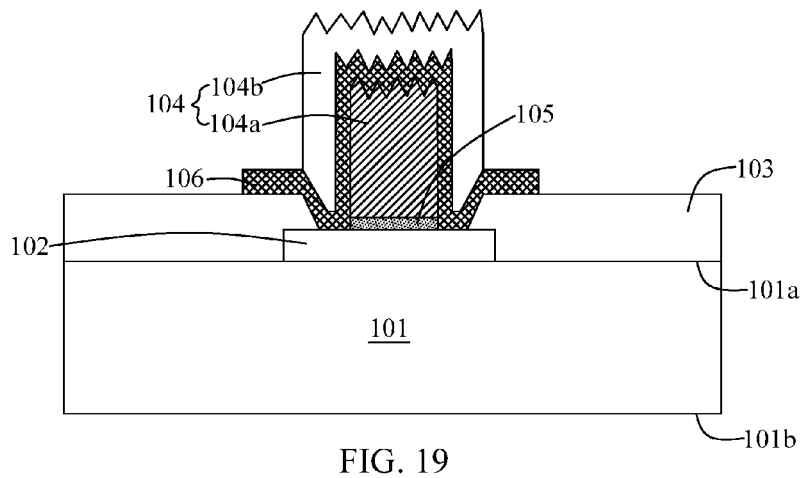

FIGS. 17-19 are cross-sectional views of the bump 104 of the semiconductor structure 100 in various shapes. In some embodiments as shown in FIG. 17, a cross section of the bump 104 is in a quadrilateral or trapezoidal shape. In some embodiments as shown in FIG. 18, the cross section of the bump 104 is in a triangular shape. In some embodiments as shown in FIG. 19, the cross section of the bump 104 is in a polygonal or irregular shape. In some embodiments, an outer surface of the conductive layer 104b, an interface between the conductive layer 104b and the interconnect structure 106 or an interface between the buffering member 104a and the interconnect structure 106 includes ripples or a wavy shape.

FIGS. 20-30 are cross-sectional views of the semiconductor structure 100 comprising the buffering member 104a protruded into the pad 102. In some embodiments, a portion of the buffering member 104a is disposed within or extended into the pad 102.

Figure 20:
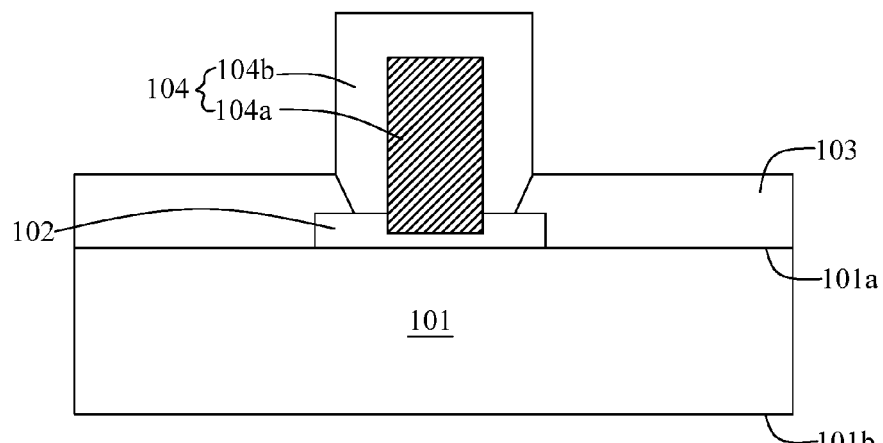
Figure 21:
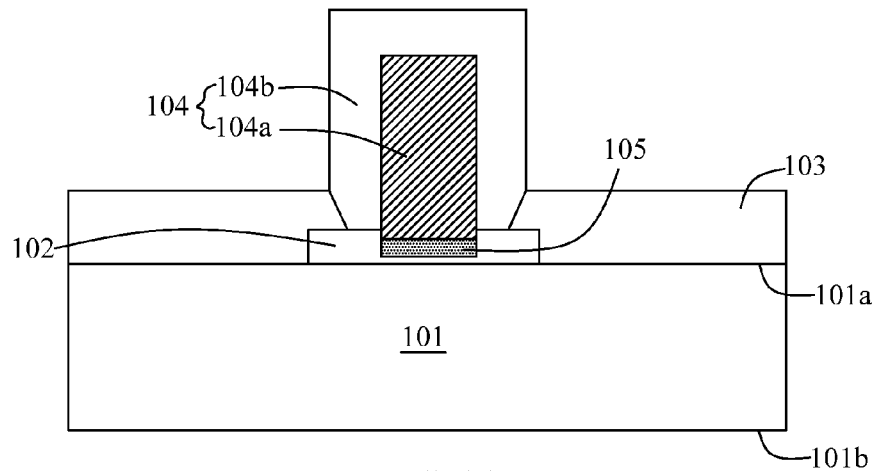
Figure 22:
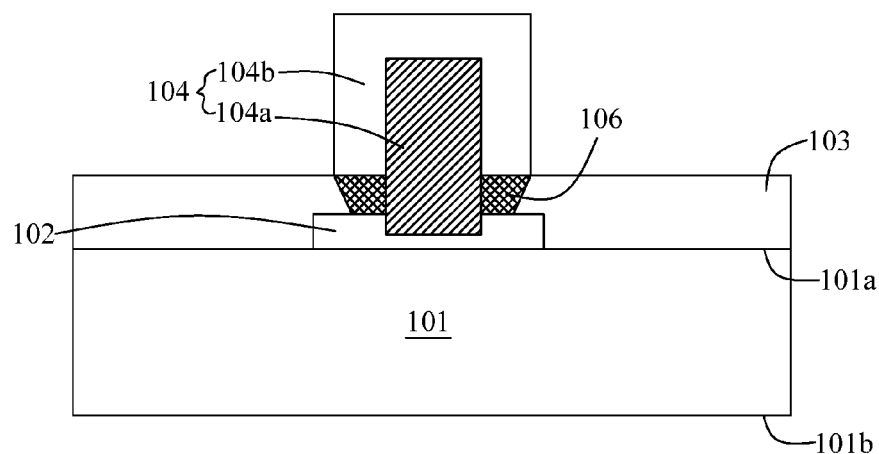
Figure 23:
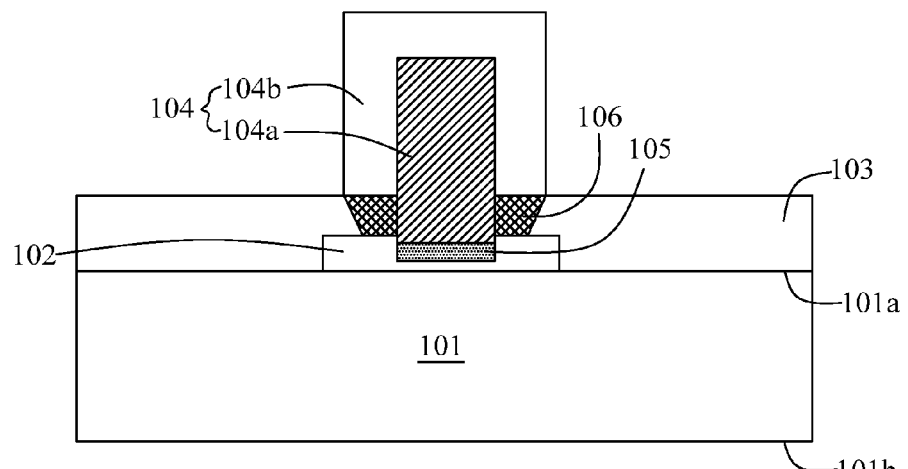

In some embodiments as shown in FIG. 20, a portion of the buffering member 104a is protruded into the pad 102 and surrounded by the pad 102. In some embodiments as shown in FIG. 21, the adhesive 105 is dispose within or surrounded by the pad 102, and a portion of the buffering member 104a is disposed over the adhesive 105. In some embodiments, a portion of the buffering member 104a is protruded into the pad 102. In some embodiments as shown in FIG. 22, the semiconductor structure 100 includes the buffering member 104a as illustrated in FIG. 20 and the interconnect structure 106 as illustrated in FIG. 6. In some embodiments as shown in FIG. 23, the semiconductor structure 100 includes the buffering member 104a as illustrated in FIG. 21 and the interconnect structure 106 as illustrated in FIG. 6.

Figure 24:
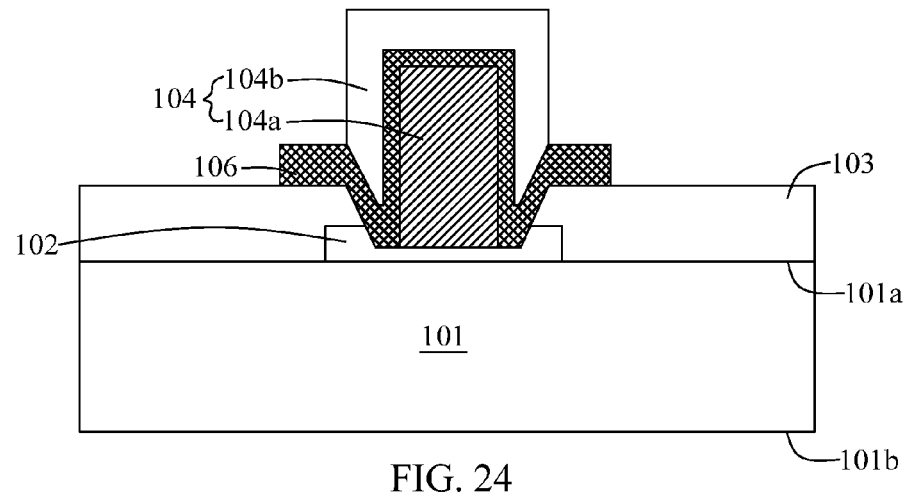
Figure 25:
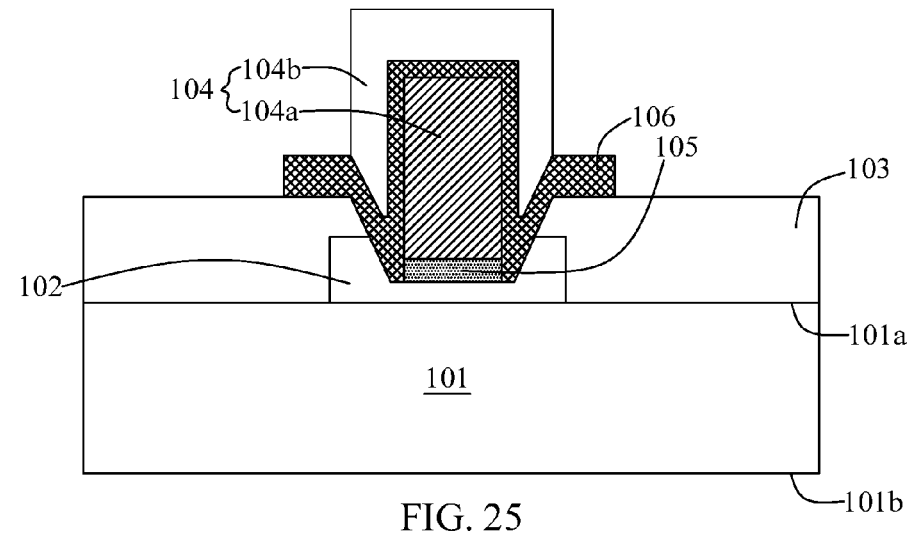

In some embodiments as shown in FIG. 24 a portion of the buffering member 104a and a portion of the interconnect structure 106 are disposed within or surrounded by the pad 102. In some embodiments as shown in FIG. 25, the semiconductor structure 100 includes the buffering member 104a and the adhesive 105 as illustrated in FIG. 21, and the interconnect structure 106 as illustrated in FIG. 24.

Figure 26:
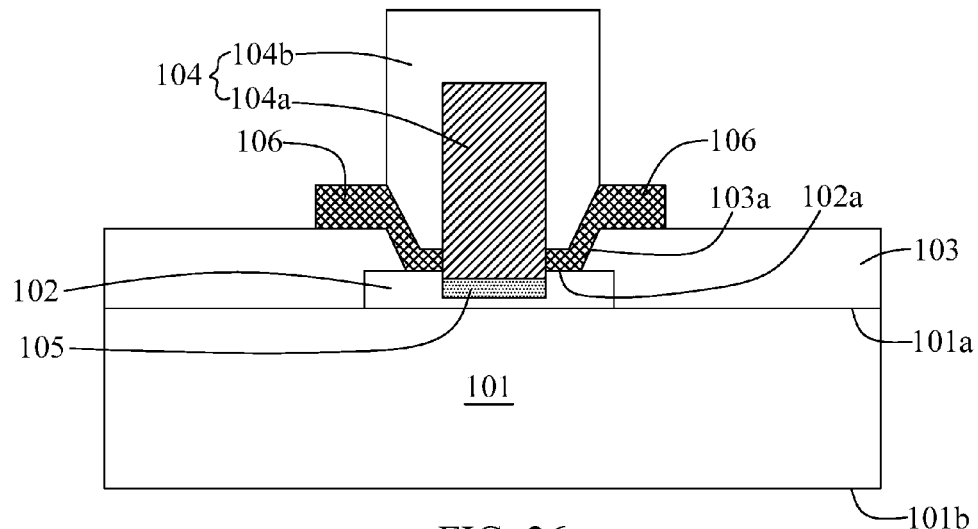
Figure 27:
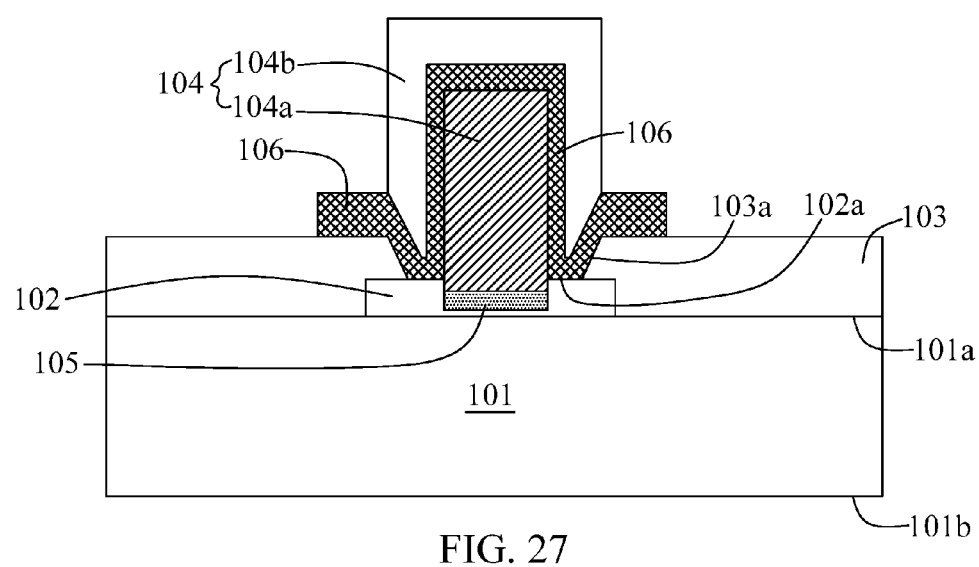

In some embodiments as shown in FIG. 26, the adhesive 105 is disposed within the pad 102, the buffering member 104a is disposed over the adhesive 105 or is disposed within the pad 102, and the interconnect structure 106 is configured as illustrated in FIG. 0.11. In some embodiments as shown in FIG. 27, the adhesive 105 is disposed within the pad 102, the buffering member 104a is disposed over the adhesive 105 or is disposed within the pad 102, and the interconnect structure 106 is configured as illustrated in FIG. 0.13.

Figure 28:
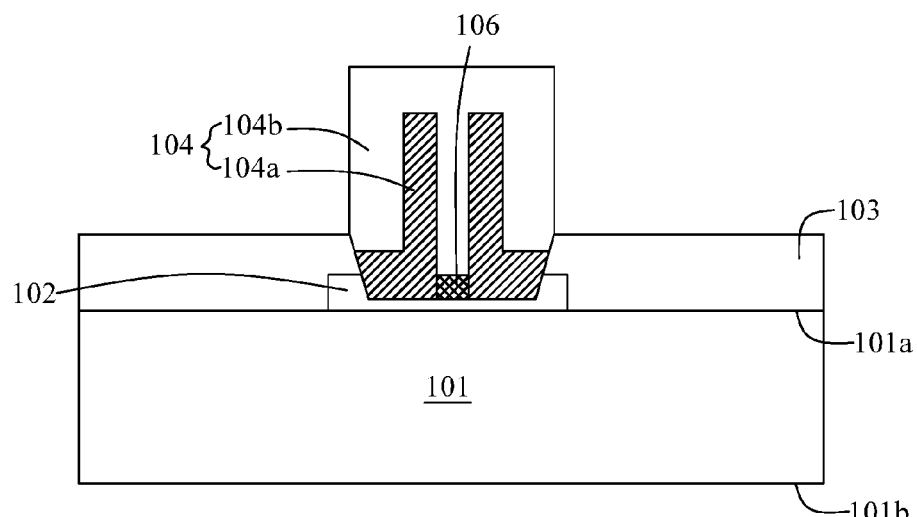
Figure 29:
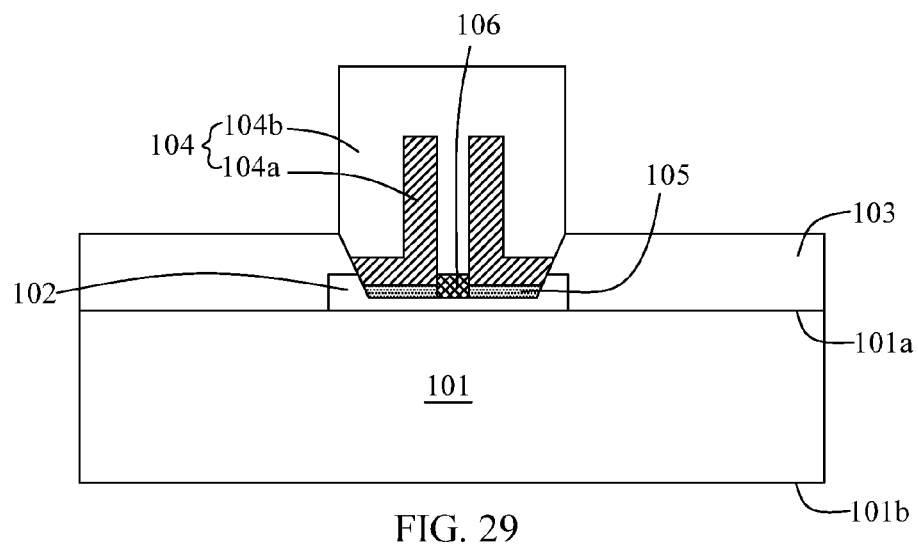
Figure 30:
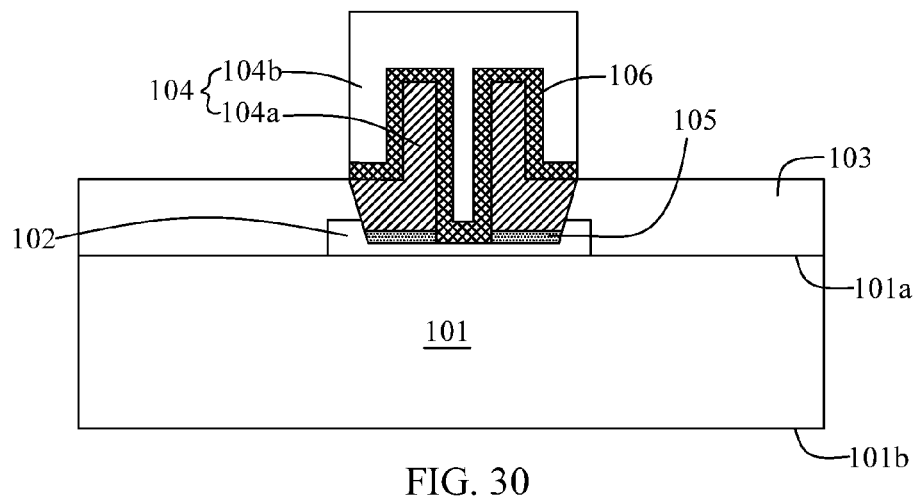

In some embodiments as shown in FIG. 28, a portion of the interconnect structure 106 and a portion of the buffering member 104a are disposed within or surrounded by the pad 102. In some embodiments as shown in FIG. 29, the adhesive 105, a portion of the buffering member 104a and a portion of the interconnect structure 106 are disposed within or surrounded by the pad 102. In some embodiments as shown in FIG. 30, the adhesive 105, a portion of the buffering member 104a and a portion of the interconnect structure 106 are disposed within the pad 102, and the interconnect structure 106 is disposed conformal to the buffering member 104a.

Figure 31:
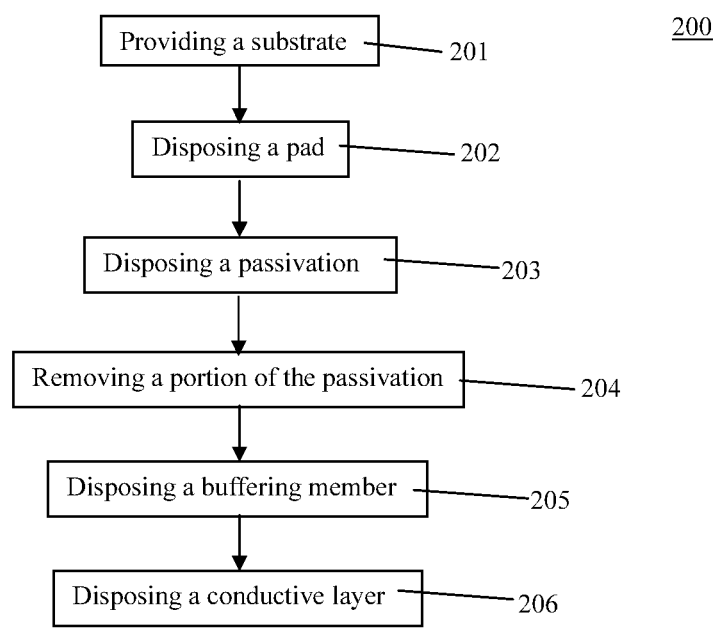
FIG. 31 is a flow chart of a method of manufacturing a semiconductor structure in accordance with some embodiments of the present disclosure.

In the present disclosure, a method of manufacturing a semiconductor structure 100 is also disclosed. In some embodiments, the semiconductor structure 100 can be formed by a method 200 of FIG. 31. The method 200 includes a number of operations and the description and illustration are not deemed as a limitation as the sequence of the operations. The method 200 includes a number of steps (201, 202, 203, 204, 205 and 206).

Figure 32:
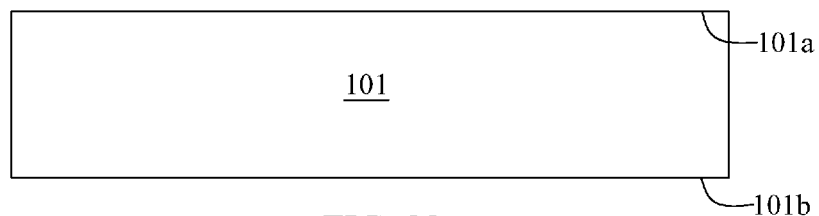
FIGS. 32-60 are schematic views of manufacturing the semiconductor structure by the method of FIG. 31 in accordance with some embodiments of the present disclosure.

In step 201, a substrate 101 is provided or received as shown in FIG. 32. In some embodiments, the substrate 101 includes a first surface 101a and a second surface 101b opposite to the first surface 101a. In some embodiments, the substrate 101 includes several conductive lines and several electrical components, such as transistors and diodes, connected by the conductive lines. In some embodiments, the substrate 101 is a semiconductive substrate. In some embodiments, the first substrate 101 includes silicon, germanium, gallium, arsenic, and combinations thereof. In some embodiments, the substrate 101 is a silicon substrate. In some embodiments, the substrate 101 is in a quadrilateral, rectangular, square, polygonal or any other suitable shapes. In some embodiments, the substrate 101 has a similar configuration as described above or illustrated in any one of FIGS. 1-30.

Figure 33:
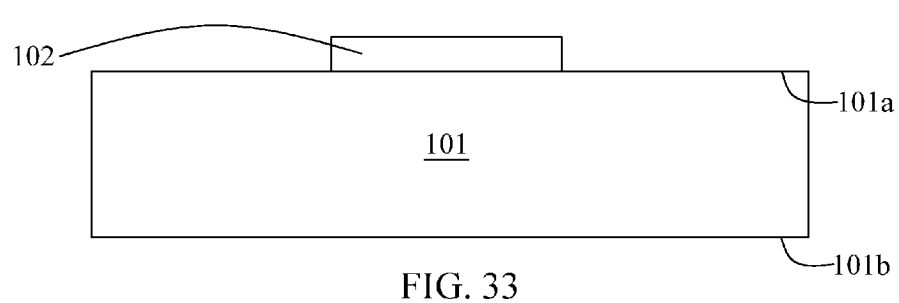

In step 202, a pad 102 is disposed over the substrate 101 as shown in FIG. 33. In some embodiments, the pad 102 is disposed over the first surface 101a of the substrate 101. In some embodiments, the pad 102 is electrically connected to a circuitry in the substrate 101. In some embodiments, the pad 102 is configured to receive a conductive structure. In some embodiments, the pad 102 is a die pad or a bond pad. In some embodiments, the pad 102 includes gold, silver, copper, nickel, tungsten, aluminum, palladium and/or alloys thereof. In some embodiments, the pad 102 is formed by electroplating or any other suitable processes. In some embodiments, the pad 102 has a similar configuration as described above or illustrated in any one of FIGS. 1-30.

Figure 34:
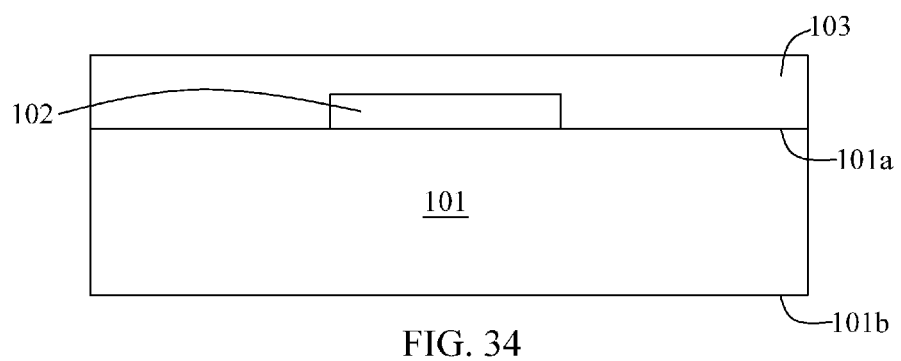

In step 203, a passivation 103 is disposed over the substrate 101 and the pad 102 as shown in FIG. 34. In some embodiments, the passivation 103 is formed with dielectric materials such as silicon oxide, silicon oxynitride, silicon nitride or the like. In some embodiments, the passivation 103 is disposed by chemical vapor deposition (CVD), plasma-enhanced chemical vapor deposition (PECVD), spin coating or any other suitable processes. In some embodiments, the passivation 103 has a similar configuration as described above or illustrated in any one of FIGS. 1-30.

Figure 35:
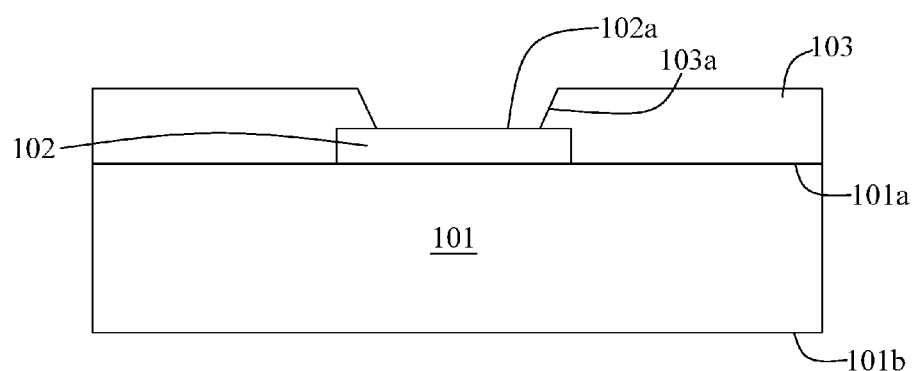

In step 204, a portion of the passivation 103 disposed over the pad 102 is removed as shown in FIG. 35. In some embodiments, the portion of the passivation 103 is removed by etching or any other suitable processes. In some embodiments, a recess 103a is formed and a portion 102a of the pad 102 is exposed from the passivation 103.

Figure 36:
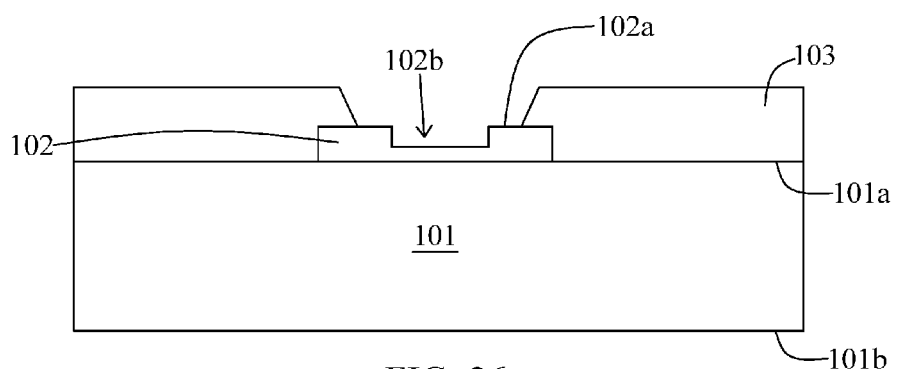

In some embodiments as shown in FIG. 36, a portion of the pad 102 is removed upon or after the portion of the passivation 103 is removed. In some embodiments, the portion of the pad 102 is removed by etching or any other suitable processes. In some embodiments, an opening 102b is formed.

In step 205, a buffering member 104a is disposed over the pad 102 as shown in any one of FIGS. 37-42. In some embodiments, the buffering member 104a is disposed by stencil squeezing, stencil filing, chemical vapor deposition (CVD) or any other suitable processes. In some embodiments, the buffering member 104a is disposed within the recess 103a. In some embodiments, the buffering member 104a is protruded from the pad 102. In some embodiments, the buffering member 104a is in a cylindrical shape. In some embodiments, the buffering member 104a includes elastic, deformable, flexible or soft material. In some embodiments, the buffering member 104a includes dielectric material. In some embodiments, the buffering member 104a is insulative. In some embodiments, the buffering member 104a includes elastomer, silicone, resin, epoxy, polymer, polyimide or polybenzoxazole (PBO). In some embodiments, the buffering member 104a has a similar configuration as described above or illustrated in any one of FIGS. 1-30.

Figure 37:
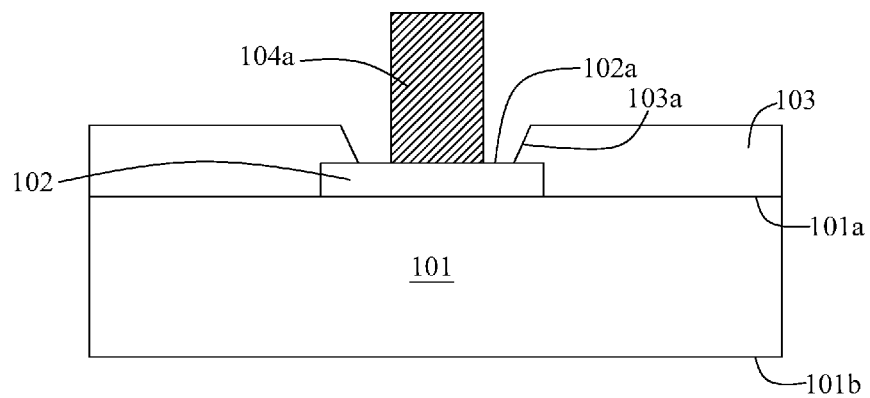
Figure 38:
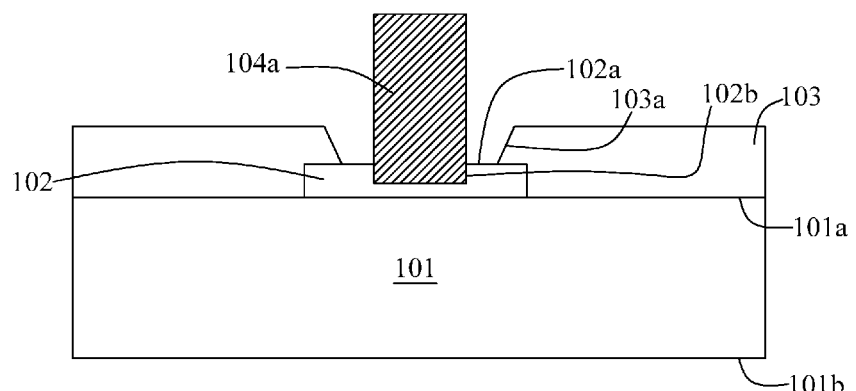

In some embodiments as shown in FIG. 37, the buffering member 104a is disposed over the portion 102a of the pad 102. In some embodiments as shown in FIG. 38, the buffering member 104a is disposed within the opening 102b after the step 204 as shown in FIG. 36. In some embodiments, the buffering member 104a is partially disposed within the pad 102.

In some embodiments as shown in FIGS. 39-42, an adhesive 105 is disposed between the buffering member 104a and the pad 102. In some embodiments, the adhesive 105 is disposed under or attached to the buffering member 104a, and then the buffering member 104a with the adhesive 105 is disposed over the pad 102. In some embodiments, the adhesive 105 is disposed over the pad 102, and then the buffering member 104a is disposed over the adhesive 105. In some embodiments, the adhesive 105 is disposed by screen printing, spin coating or any other suitable processes. In some embodiments, the adhesive 105 has a similar configuration as described above or illustrated in any one of FIGS. 4, 5, 9-13, 15-19, 21, 23, 25-27, 29 and 30.

Figure 39:
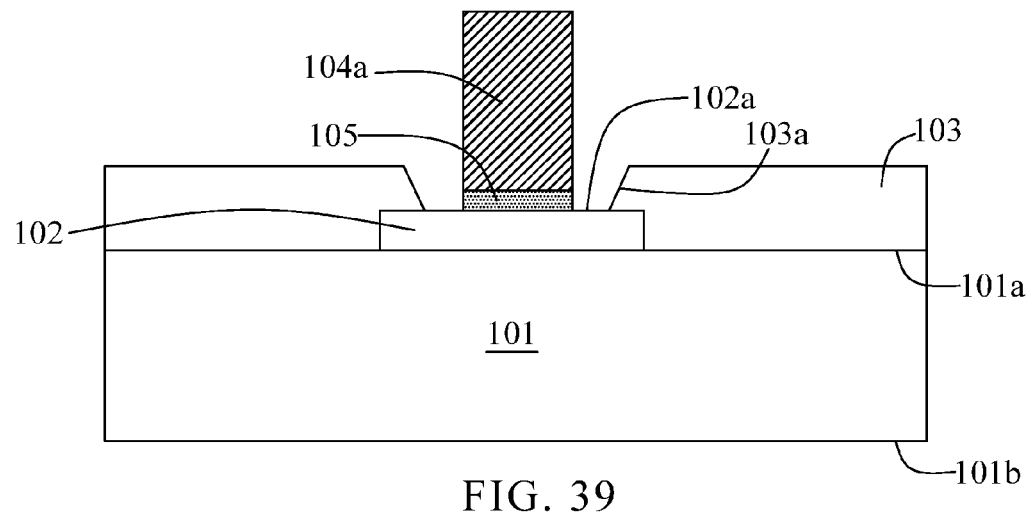
Figure 40:
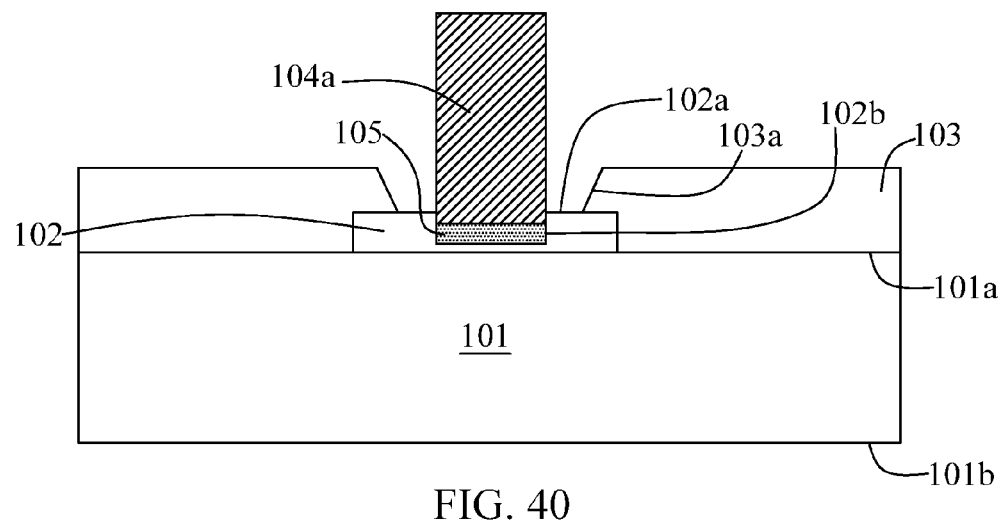

In some embodiments as shown in FIG. 39, the adhesive 105 is disposed over the portion 102a of the pad 102 and within the recess 103a. In some embodiments as shown in FIG. 40, the adhesive 105 is disposed within the pad 102 or within the 102b opening of the pad 102.

Figure 41:
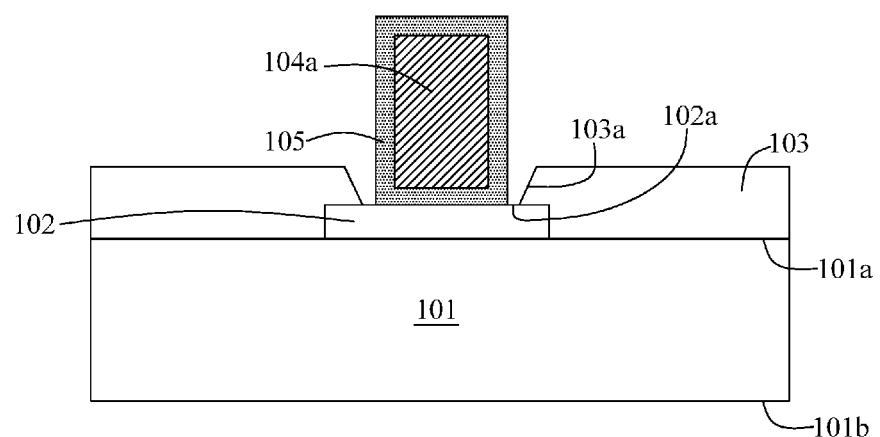
Figure 42:
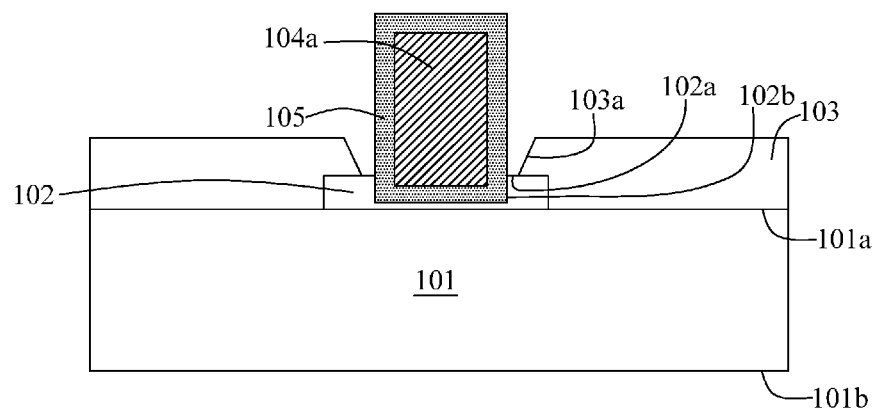
Figure 43:
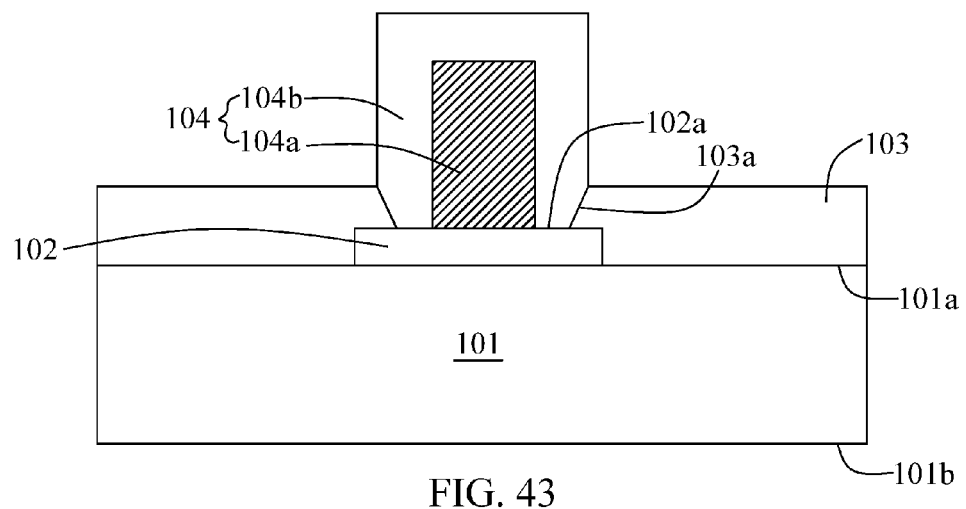
Figure 44:
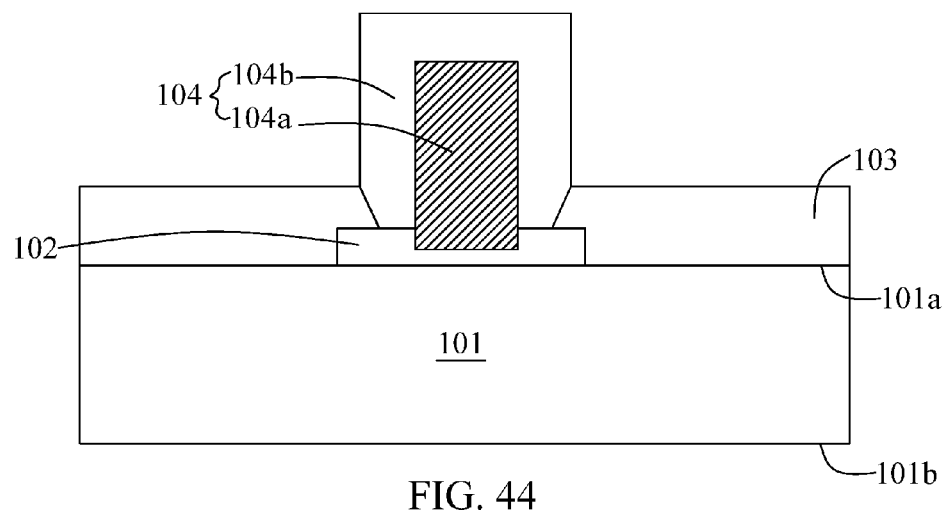
Figure 45:
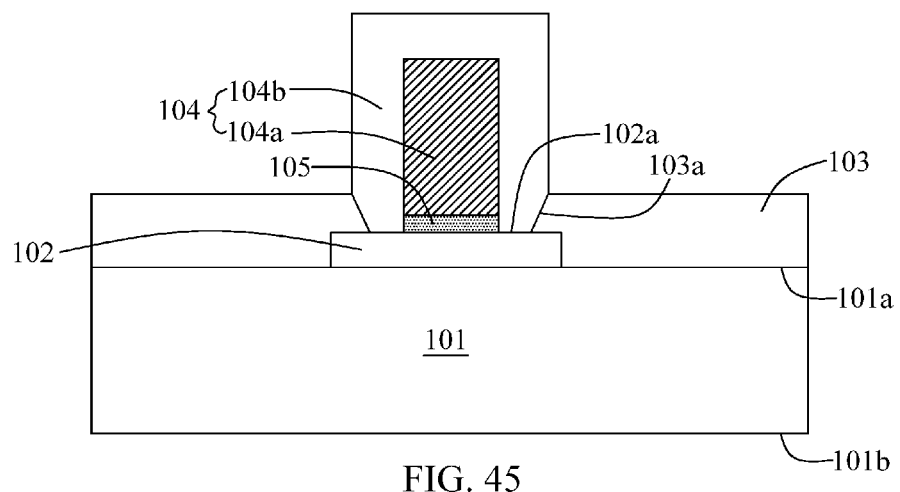
Figure 46:
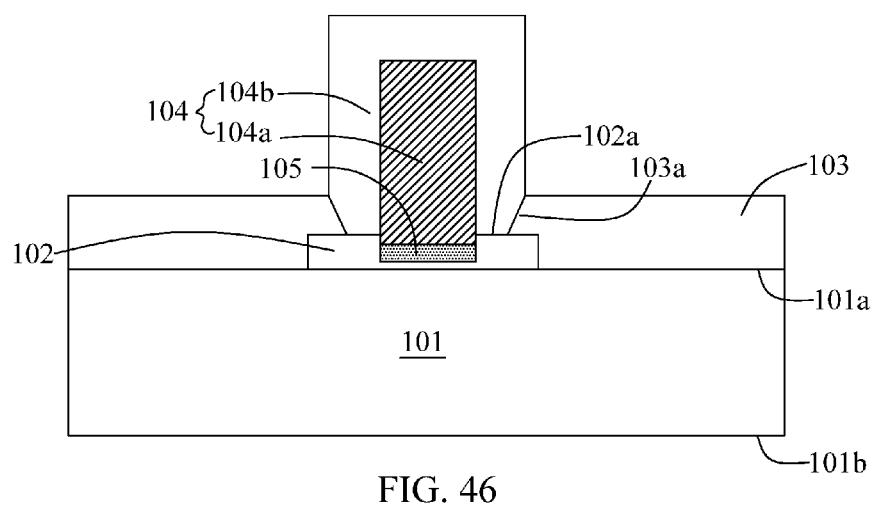
Figure 47:
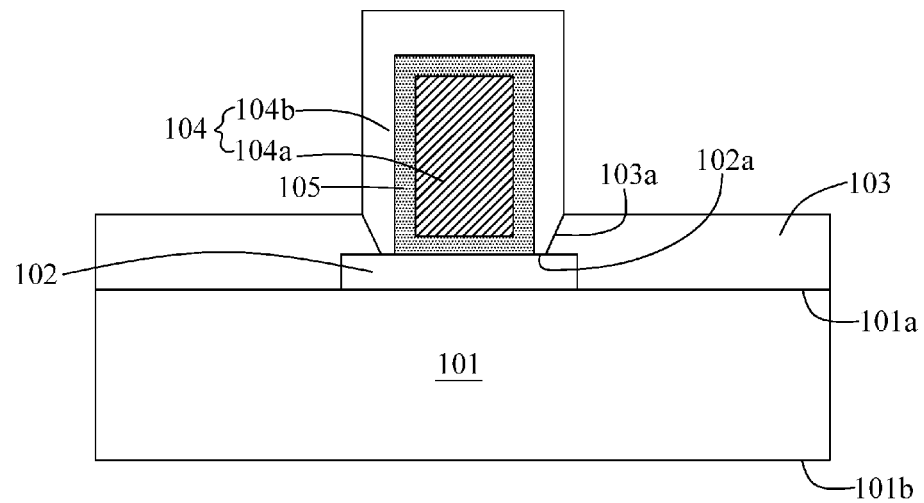
Figure 48:
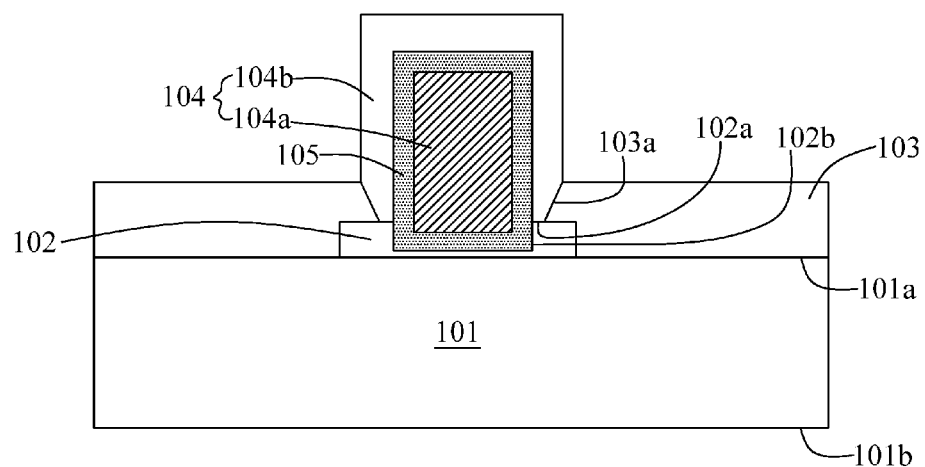
Figure 49:
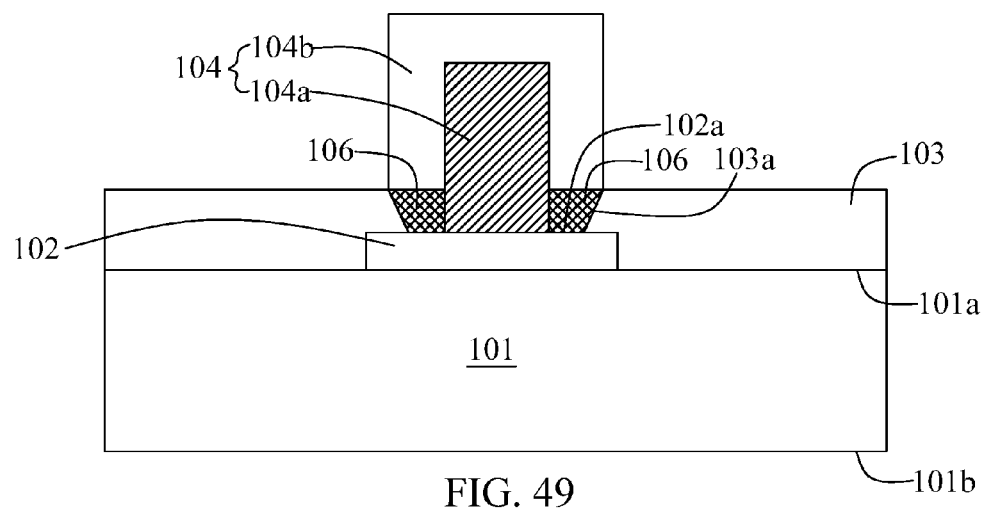
Figure 50:
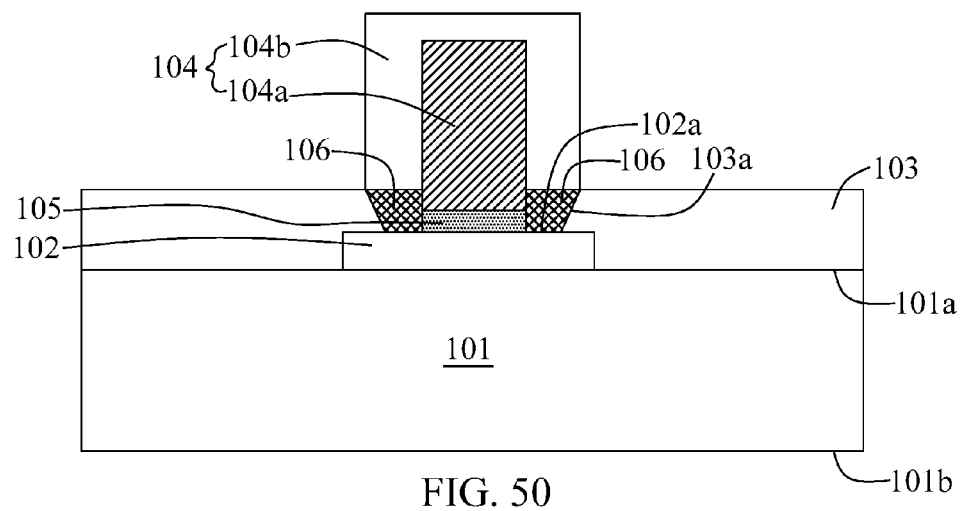
Figure 51:
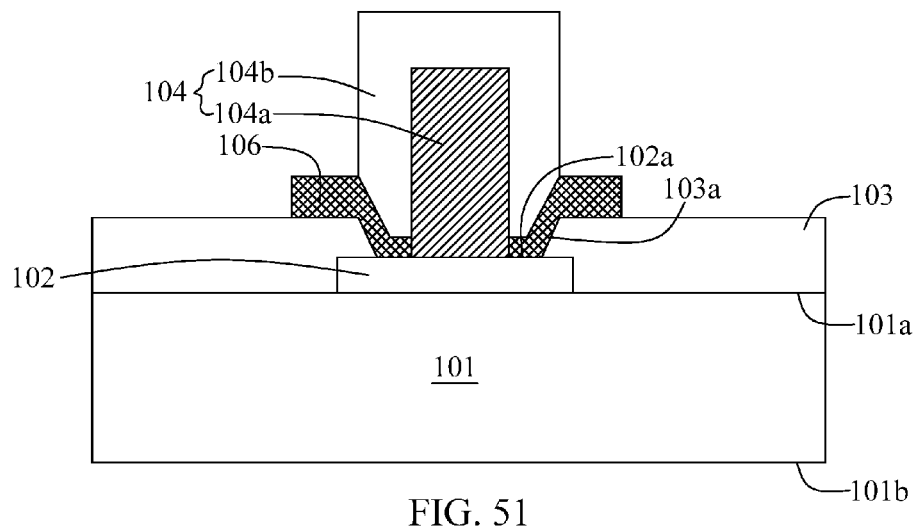
Figure 52:
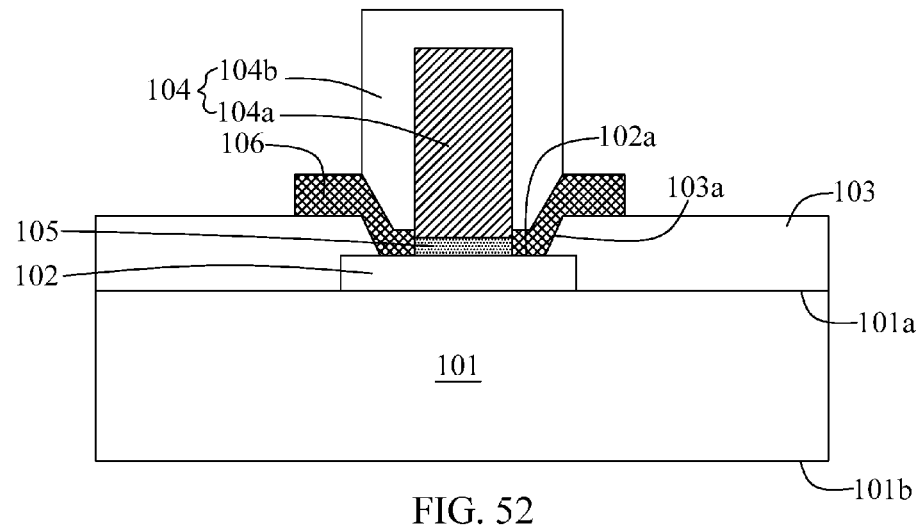
Figure 53:
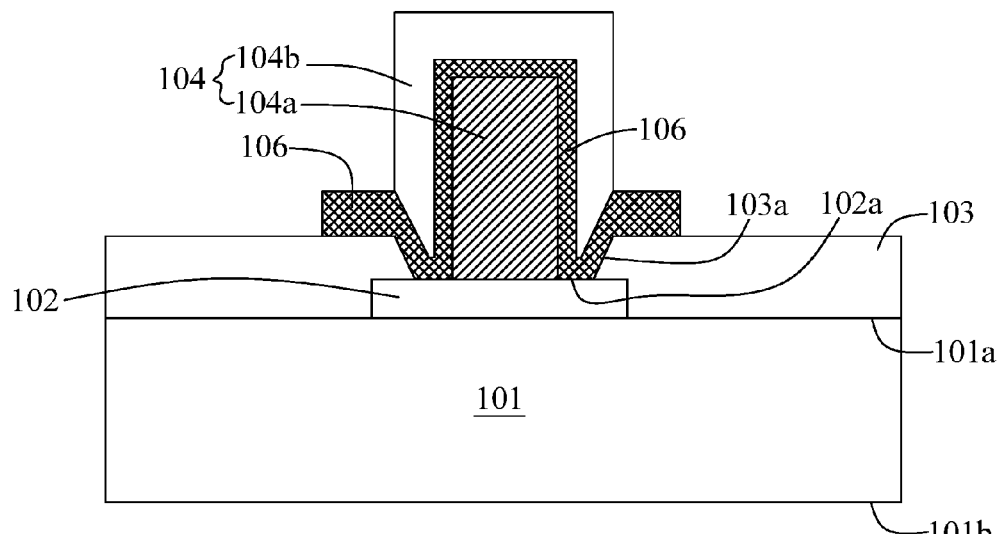
Figure 54:
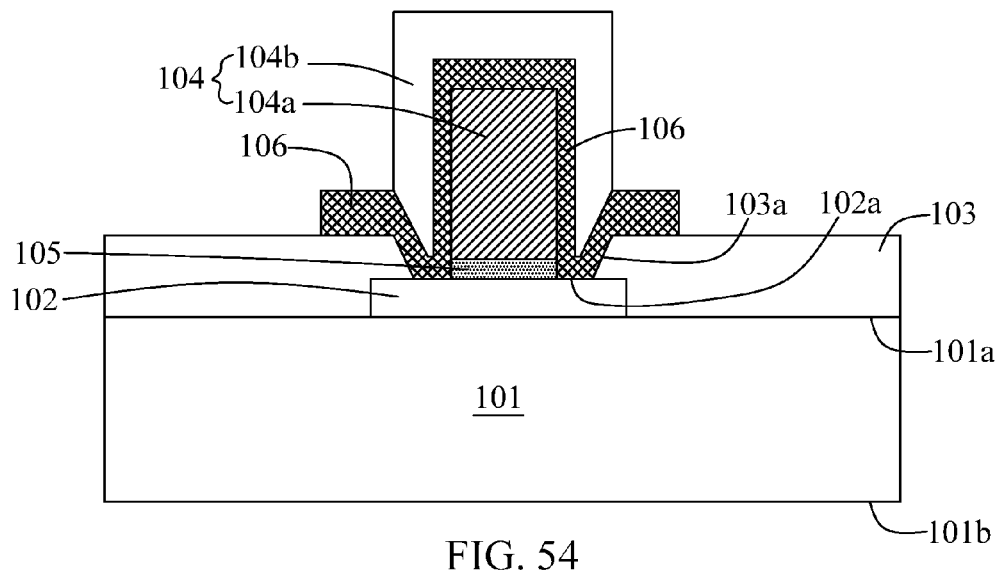
Figure 55:
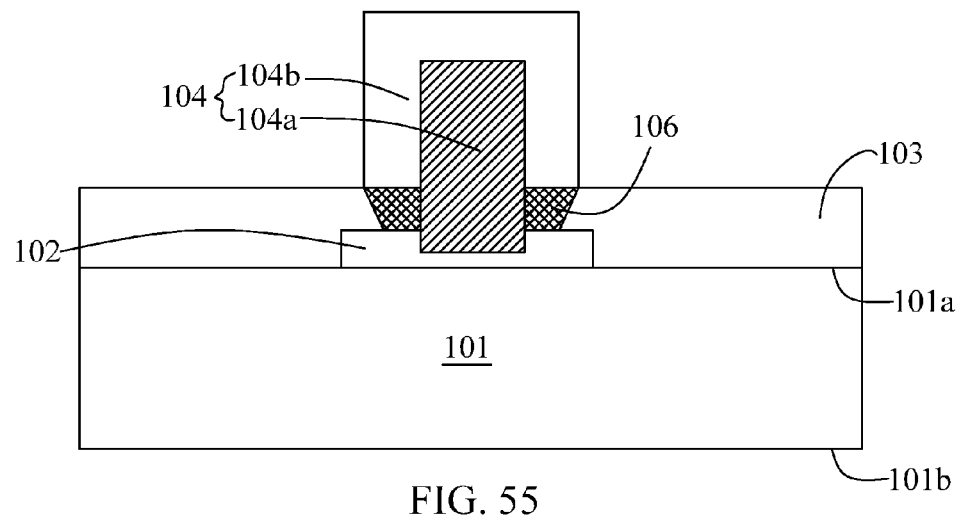
Figure 56:
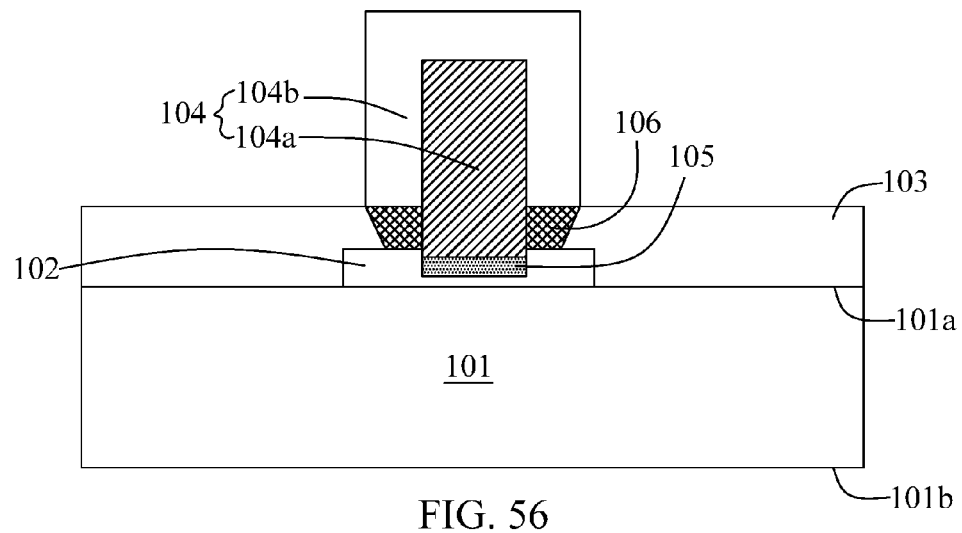
Figure 57:
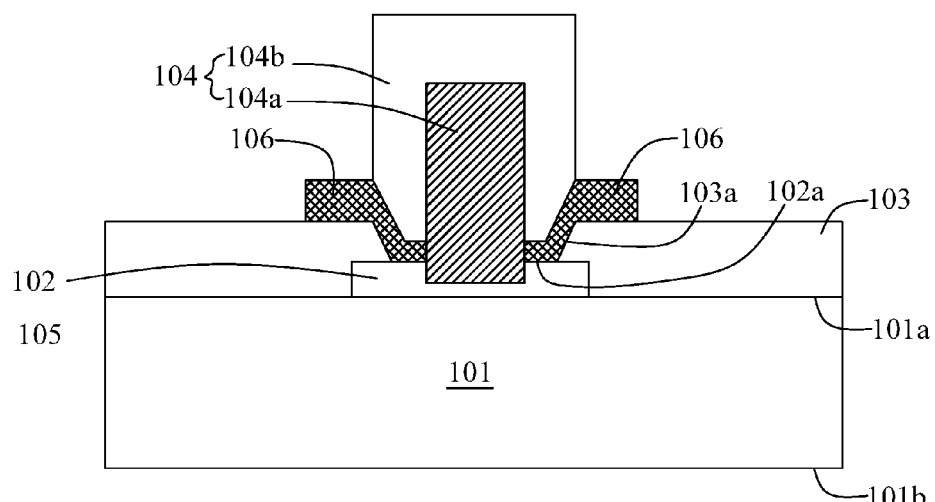
Figure 58:
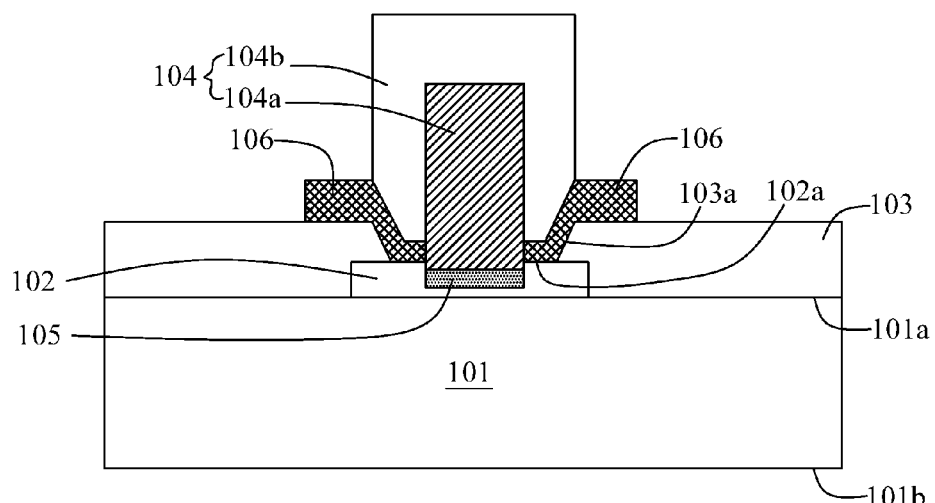
Figure 59:
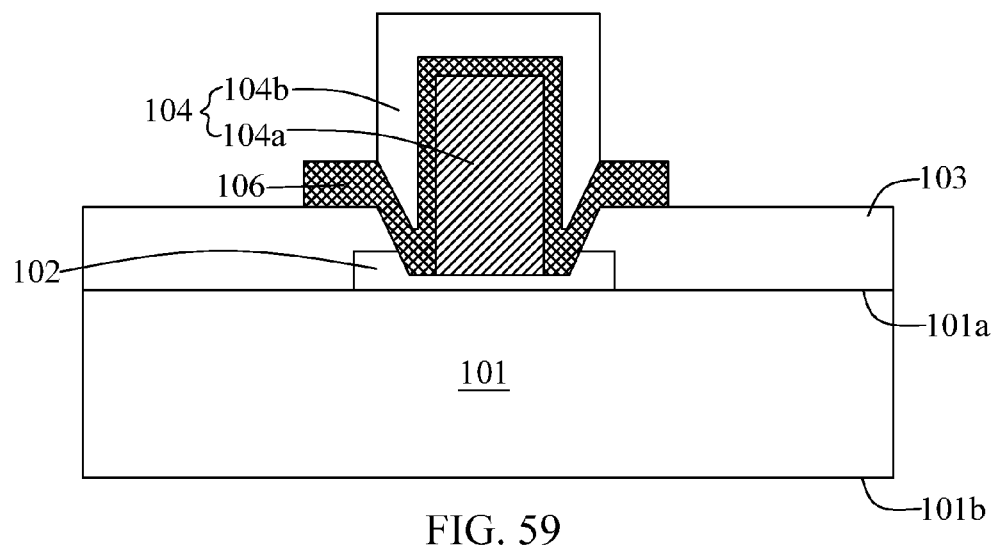
Figure 60:
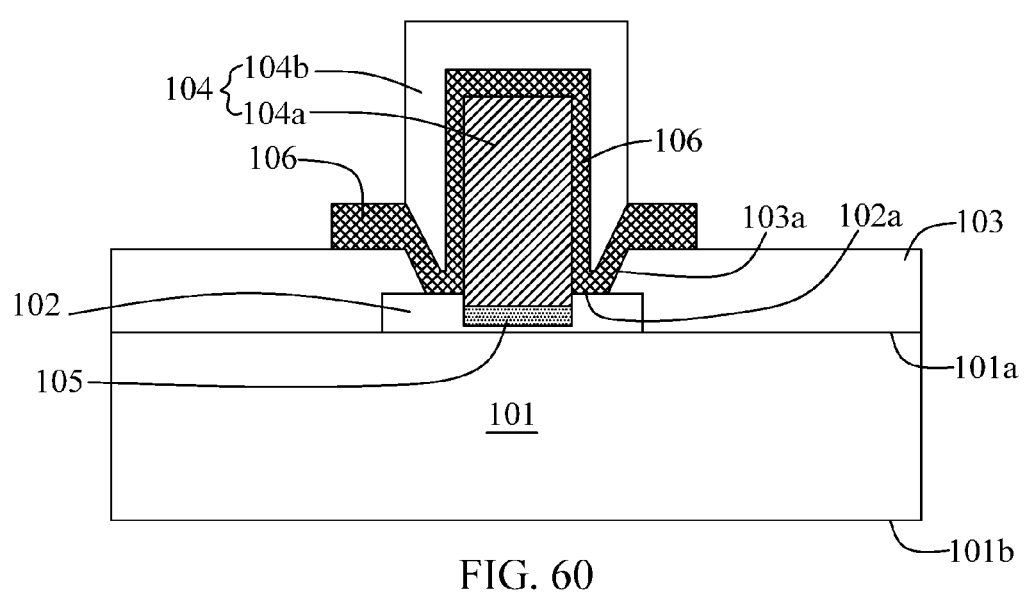

In some embodiments as shown in FIG. 41, the adhesive 105 encapsulates the buffering member 104a, and then the buffering member 104a with the adhesive 105 surrounding the buffering member 104a is disposed over the pad 102 and within the recess 103a. In some embodiments, the adhesive 105 is disposed conformal to an outer surface of the buffering member 104a. In some embodiments as shown in FIG. 42, a portion of the buffering member 104a and a portion of the adhesive 105 are disposed within the opening 102b of the pad 102.

In step 206, a conductive layer 104b is disposed over or around the buffering member 104a as shown in any one of FIGS. 43-60. In some embodiments as shown in FIGS. 43-48, the conductive layer 104b is disposed over the buffering member 104a of FIGS. 37-42 respectively. In some embodiments, the conductive layer 104b is formed by disposing a photoresist (PR) over the passivation 103, removing a portion of the PR so as to pattern the PR, disposing a conductive material within the removed portion of the PR, and removing the PR. In some embodiments, the conductive material is disposed by electroplating or any other suitable processes. In some embodiments, the PR is disposed by deposition or any other suitable processes. In some embodiments, the portion of the PR is removed by photolithography, etching or any other suitable processes. In some embodiments, the PR is wholly removed by etching, stripping or any other suitable processes. In some embodiments, the conductive layer 104b has a similar configuration as described above or illustrated in any one of FIGS. 1-30.

In some embodiments, a bump 104 comprising the buffering member 104a and the conductive layer 104b is formed. In some embodiments, the bump is elastic, deformable or compressible. In some embodiments, the bump 104 is configured to absorb a force applied over the bump 104 or a stress internal to the semiconductor structure 100.

In some embodiments, an interconnect structure 106 is disposed between the pad 102 and the conductive layer 104b as shown in any one of FIGS. 49-60. In some embodiments, the conductive layer 104b is electrically connected to the pad 102 through the interconnect structure 106. In some embodiments, an interconnect structure 106 is at least partially disposed over the pad 102. In some embodiments, the interconnect structure 106 is a UBM or a part of the UBM. In some embodiments, the interconnect structure 106 has a similar configuration as described above or illustrated in any one of FIGS. 6-19 and 22-30.

In some embodiments, the interconnect structure 106 and the conductive layer 104b are formed by disposing a first conductive material over the passivation 103 or conformal to an outer surface of the buffering member 104a, disposing the PR over the first conductive material and the passivation 103, removing a portion of the PR so as to pattern the PR, disposing a second conductive material within the removed portion of the PR, and removing the PR and a portion of the first conductive material disposed over the passivation 103. In some embodiments, the second conductive material is disposed by sputtering, electroplating or any other suitable processes.

In some embodiments as shown in FIGS. 49-54, the interconnect structure 106 surrounds the buffering member 104a or the adhesive 105 disposed over the pad 102 as illustrated in FIG. 37, 39 or 41. In some embodiments as shown in FIGS. 55-60, the interconnect structure 106 surrounds the buffering member 104a or the adhesive 105 disposed within the pad 102 as illustrated in FIG. 38, 40 or 42.

One aspect of the present disclosure provides a semiconductor structure including a substrate; a pad disposed over the substrate; a passivation disposed over the substrate and exposing a portion of the pad; and a bump disposed over the portion of the pad, wherein the bump includes a buffering member disposed over the portion of the pad; and a conductive layer surrounding the buffering member and electrically connected to the pad.

Another aspect of the present disclosure provides a method of manufacturing a semiconductor structure which includes providing a substrate; disposing a pad over the substrate; disposing a passivation over the substrate and the pad; removing a portion of the passivation disposed over the pad; disposing a buffering member over a portion of the pad; and disposing a conductive layer over or around the buffering member, wherein the buffering member is surrounded by the conductive layer, and the conductive layer is electrically connected to the pad.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure comprising:
a substrate;
a pad disposed over the substrate;
a passivation disposed over the substrate and exposing a portion of the pad; and
a bump disposed over the portion of the pad;
wherein the bump includes a buffering member disposed over the portion of the pad, and a conductive layer surrounding the buffering member and electrically connected to the pad;
wherein a portion of the buffering member is disposed within or extended into the pad.

2. The semiconductor structure of claim 1, wherein the conductive layer is interfaced with the portion of the pad.

3. The semiconductor structure of claim 1, wherein the buffering member is insulative, elastic or deformable.

4. The semiconductor structure of claim 1, wherein the buffering member includes elastomer or polymer, or the conductive layer includes copper or solder.

5. The semiconductor structure of claim 1, wherein the bump is elastic or deformable.

6. The semiconductor structure of claim 1, wherein the bump is electrically connected to the pad.

7. The semiconductor structure of claim 1, wherein a portion of the conductive layer is disposed within or surrounded by the buffering member.

8. A method of manufacturing a semiconductor structure, comprising:
providing a substrate;
disposing a pad over the substrate;
disposing a passivation over the substrate and the pad;
removing a portion of the passivation disposed over the pad;
disposing a buffering member over a portion of the pad; and
disposing a conductive layer over or around the buffering member,
wherein the buffering member is surrounded by the conductive layer, and the conductive layer is electrically connected to the pad;
wherein the method further comprising removing a portion of the pad upon or after the removal of the portion of the passivation.

9. The method of claim 8, wherein the buffering member is disposed by stencil squeezing.

10. A semiconductor structure comprising:
a substrate;
a pad disposed over the substrate;
a passivation disposed over the substrate and exposing a portion of the pad;
a bump disposed over the portion of the pad; and
an interconnect structure disposed between the conductive layer and the pad and configured to electrically connect the conductive layer with the pad;
wherein the bump includes a buffering member disposed over the portion of the pad, and a conductive layer surrounding the buffering member and electrically connected to the pad;
wherein a portion of the interconnect structure is disposed within or surrounded by the pad.

11. The semiconductor structure of claim 10, wherein the interconnect structure is an under bump metallization (UBM) partially disposed over or partially surrounded by the passivation.

12. The semiconductor structure of claim 10, wherein the interconnect structure is disposed within or surrounded by the buffering member.

13. The semiconductor structure of claim 10, wherein the interconnect structure is conformal to the buffering member.

14. The semiconductor structure of claim 10, wherein a portion of the interconnect structure is disposed between the conductive layer and the buffering member.

15. A semiconductor structure comprising:
   a substrate;
   a pad disposed over the substrate;
   a passivation disposed over the substrate and exposing a portion of the pad;
   a bump disposed over the portion of the pad; and
   an adhesive disposed between the buffering member and the portion of the pad;
   wherein the bump includes a buffering member disposed over the portion of the pad, and a conductive layer surrounding the buffering member and electrically connected to the pad.

16. The semiconductor structure of claim 15, wherein the adhesive is disposed between the buffering member and the conductive layer, or the buffering member is encapsulated by the adhesive.

17. The semiconductor structure of claim 15, wherein the adhesive is disposed within or surrounded by the pad.

* * * * *